(12) United States Patent
Bok et al.

(10) Patent No.: US 11,638,356 B2
(45) Date of Patent: Apr. 25, 2023

(54) DISPLAY DEVICE

(71) Applicant: Samsung Display Co., Ltd., Yongin-si (KR)

(72) Inventors: Seung-Iyong Bok, Hwaseong-si (KR); Yong-Han Park, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 48 days.

(21) Appl. No.: 16/837,901

(22) Filed: Apr. 1, 2020

(65) Prior Publication Data
US 2021/0014982 A1    Jan. 14, 2021

(30) Foreign Application Priority Data

Jul. 9, 2019  (KR) .................. 10-2019-0082783

(51) Int. Cl.
| | | |
|---|---|---|
| H05K 5/00 | (2006.01) | |
| H05K 5/02 | (2006.01) | |
| H01L 51/52 | (2006.01) | |
| H01L 51/00 | (2006.01) | |
| H01L 27/32 | (2006.01) | |
| H05K 1/18 | (2006.01) | |

(52) U.S. Cl.
CPC ......... *H05K 5/0017* (2013.01); *H01L 27/322* (2013.01); *H01L 51/0097* (2013.01); *H01L 51/5246* (2013.01); *H05K 1/189* (2013.01); *H05K 5/0217* (2013.01); *H01L 27/3244* (2013.01); *H01L 2251/5338* (2013.01); *H01L 2251/5369* (2013.01); *H05K 2201/10128* (2013.01)

(58) Field of Classification Search
None
See application file for complete search history.

(56) References Cited

U.S. PATENT DOCUMENTS

| | | |
|---|---|---|
| 9,098,241 B1 | 8/2015 | Cho et al. |
| 10,089,920 B2 | 3/2018 | Cho et al. |

(Continued)

FOREIGN PATENT DOCUMENTS

| | | |
|---|---|---|
| KR | 10-2016-0059372 | 5/2016 |
| KR | 10-2017-0062327 | 6/2017 |

(Continued)

*Primary Examiner* — Anthony J Frost
(74) *Attorney, Agent, or Firm* — H.C. Park & Associates, PLC

(57) ABSTRACT

A display device including a flexible display panel and a roller disposed on a side portion of the flexible display panel to wind the flexible display panel, in which the flexible display panel includes a first substrate including a first base substrate having a display region and a non-display region adjacent to each other, and a light emitting element layer including light emitting elements disposed on the display region, a second substrate including a second base substrate opposing the first base substrate, and a color conversion layer disposed on the second base substrate and corresponding to each light emitting element, and an adhesive filling layer disposed in the display region to form a cell gap between the first and second substrate, and disposed in the non-display region to be in contact with the first and second base substrates to couple and seal the first and second base substrates.

23 Claims, 28 Drawing Sheets

(56) References Cited

U.S. PATENT DOCUMENTS

| | | | |
|---|---|---|---|
| 10,143,095 B2 | 4/2018 | Kim et al. | |
| 10,299,391 B2 | 5/2019 | Kim et al. | |
| 10,304,417 B2 | 5/2019 | Park et al. | |
| 10,424,272 B2 | 9/2019 | Yoon et al. | |
| 10,444,613 B2 | 10/2019 | Seo et al. | |
| 2011/0169816 A1* | 7/2011 | Hsu | G09G 3/3611 345/99 |
| 2014/0362512 A1* | 12/2014 | Hinson | G06F 1/1601 361/679.21 |
| 2016/0259210 A1* | 9/2016 | Kim | G02F 1/133617 |
| 2017/0031388 A1* | 2/2017 | Han | G09G 3/3233 |
| 2017/0196102 A1* | 7/2017 | Shin | H05K 1/111 |
| 2017/0222178 A1* | 8/2017 | Kang | H01L 51/5281 |
| 2017/0367198 A1 | 12/2017 | Park et al. | |
| 2018/0065162 A1 | 3/2018 | Mikami et al. | |
| 2018/0110137 A1* | 4/2018 | Kim | H05K 5/0217 |
| 2018/0114471 A1 | 4/2018 | Park et al. | |
| 2018/0160554 A1 | 6/2018 | Kang et al. | |

FOREIGN PATENT DOCUMENTS

| | | |
|---|---|---|
| KR | 10-2017-0080746 | 7/2017 |
| KR | 10-2017-0109042 | 9/2017 |
| KR | 10-1773443 | 9/2017 |
| KR | 10-2017-0123854 | 11/2017 |
| KR | 10-2017-0126061 | 11/2017 |
| KR | 10-2017-0143112 | 12/2017 |
| KR | 10-2018-0028568 | 3/2018 |
| KR | 10-2018-0042516 | 4/2018 |
| KR | 10-2018-0045980 | 5/2018 |
| KR | 10-2018-0134236 | 12/2018 |
| KR | 10-2007-0109520 | 11/2020 |

* cited by examiner

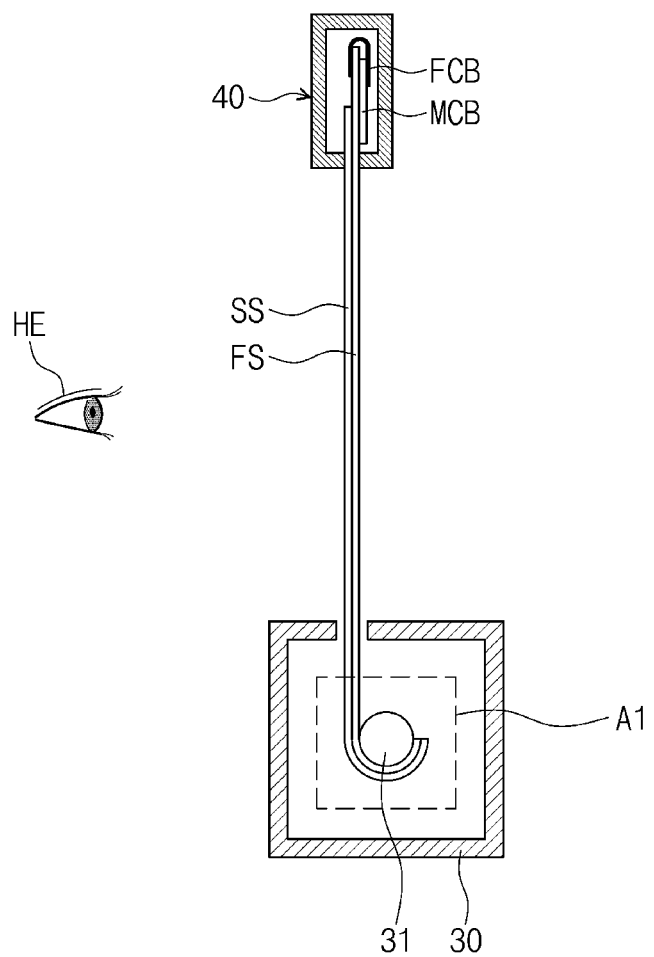

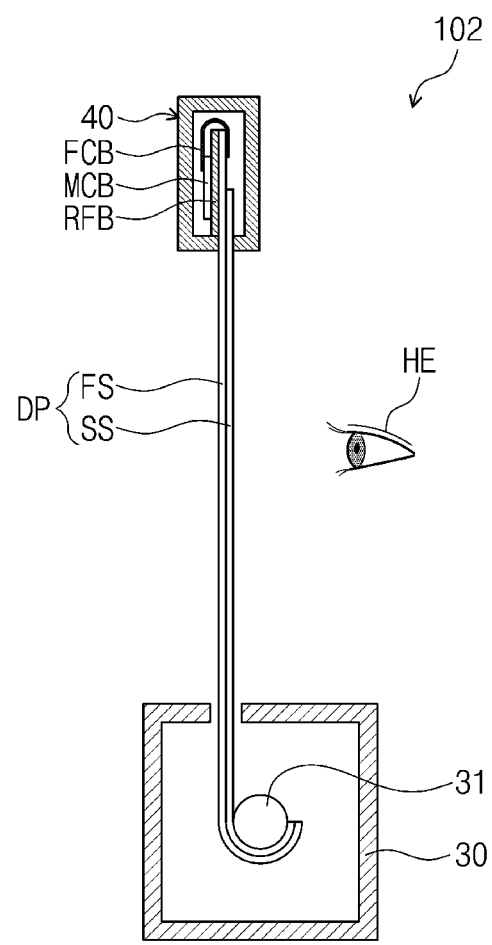

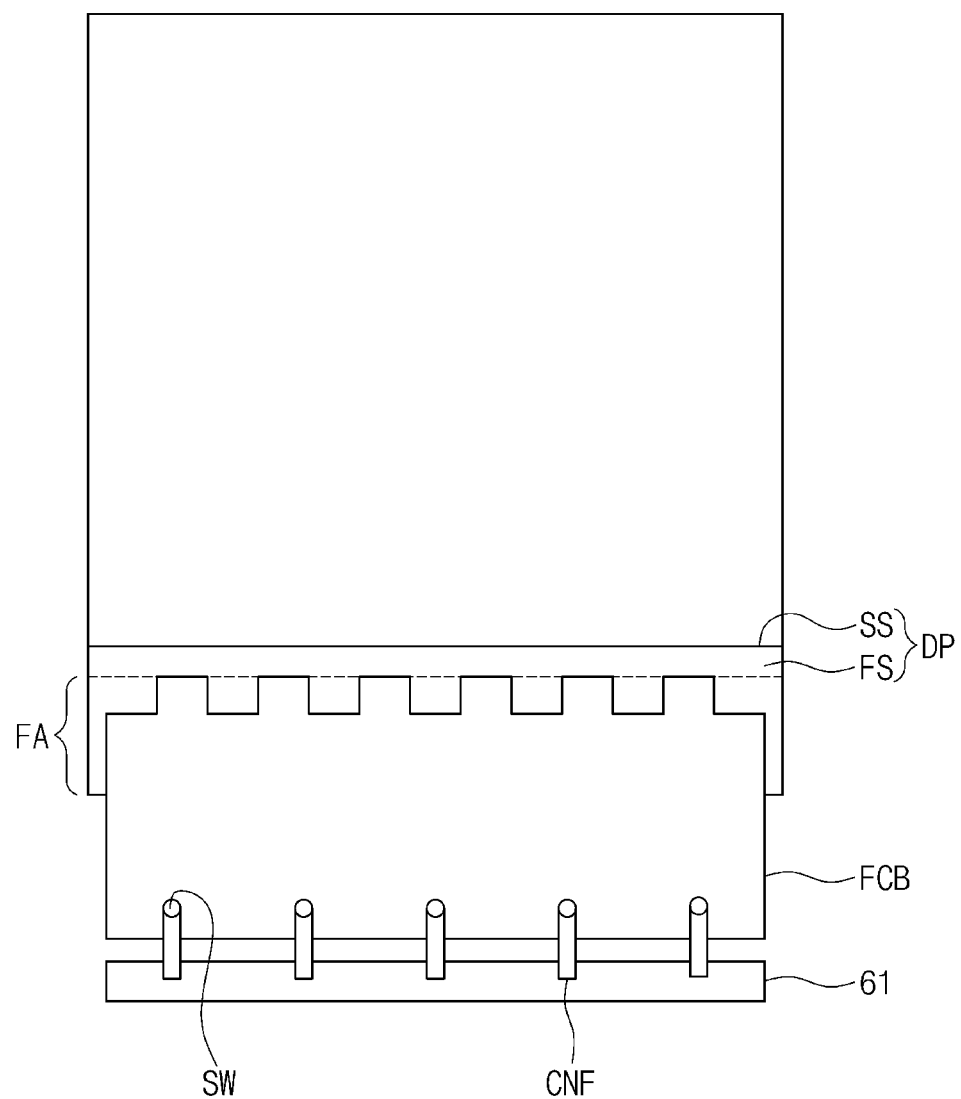

DISPLAY DEVICE

CROSS-REFERENCE TO RELATED APPLICATION

This application claims priority from and the benefit of Korean Patent Application No. 10-2019-0082783, filed on Jul. 9, 2019, which is hereby incorporated by reference for all purposes as if fully set forth herein.

BACKGROUND

Field

Exemplary embodiments of the invention relate generally to a display device and, more specifically, to a rollable display device.

Discussion of the Background

A variety of display devices including flexible display panels are being developed to meet recent market demands. For example, recent display devices include a curved display device, which has a fixed specific curvature, a foldable display device, which can be bent with a small curvature radius or can be folded along a folding axis, and a rollable display device, which can be rolled with a specific curvature radius. In particular, the rollable display devices are being widely studied due to its excellent portability over a display area.

However, the flexible display panel of the rollable display device has a structure, in which various components are stacked, and thus, some of the components may be cracked by a stress exerted to the rollable display device when the rollable display device is rolled.

The above information disclosed in this Background section is only for understanding of the background of the inventive concepts, and, therefore, it may contain information that does not constitute prior art.

SUMMARY

Rollable display devices constructed according to exemplary embodiments of the invention are capable of relieving stress during its rolling operation to provide high reliability.

Additional features of the inventive concepts will be set forth in the description which follows, and in part will be apparent from the description, or may be learned by practice of the inventive concepts.

A display device including a flexible display panel, and a roller disposed on a side portion of the flexible display panel and configured to wind the flexible display panel, in which the flexible display panel includes a first substrate including a first base substrate having a display region and a non-display region adjacent to each other, and a light emitting element layer including a plurality of light emitting elements disposed on the display region of the first base substrate, a second substrate including a second base substrate opposing the first base substrate, and a color conversion layer disposed on the second base substrate and corresponding to each of the plurality of light emitting elements, and an adhesive filling layer disposed in the display region to form a cell gap between the first substrate and the second substrate, and disposed in the non-display region to be in contact with the first and second base substrates to couple and seal the first and second base substrates.

A display device according to another exemplary embodiment includes a flexible display panel, and a roller disposed on a side portion of the flexible display panel and configured to wind the flexible display panel, in which the flexible display panel includes a first substrate including a first base substrate having a display region and a non-display region adjacent to each other, and a light emitting element layer including a plurality of light emitting elements disposed on the display region of the first base substrate, the first base substrate including a glass material, a second substrate including a second base substrate opposing the first base substrate and includes a glass material, and a color conversion layer disposed on the second base substrate to correspond to each of the plurality of light emitting elements, and an adhesive filling layer disposed in the display region to form a cell gap between the first substrate and the second substrate, and disposed in the non-display region to be in contact with the first and second base substrates to couple and seal the first and second base substrates, and each of the light emitting elements has a length ranging from several nanometers to several hundreds of micrometers A display device to still another exemplary embodiment includes a flexible display panel including a display region and a non-display region adjacent to each other, a roller disposed on a side portion of the flexible display panel and configured to wind the flexible display panel, and a housing accommodating the roller, in which the housing includes a transmission window disposed in a front portion of the housing and exposing a first region of the flexible display panel, and the first region is configured to display a first image through the transmission window.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 2A is a cross-sectional view of a display device in an active state.

FIG. 10 is a cross-sectional view of a display device according to an exemplary embodiment.

FIG. 18 is a plan view illustrating a structure, in which a flexible display panel and an inner roller are coupled to each other, according to an exemplary embodiment.

DETAILED DESCRIPTION

Figure 1:
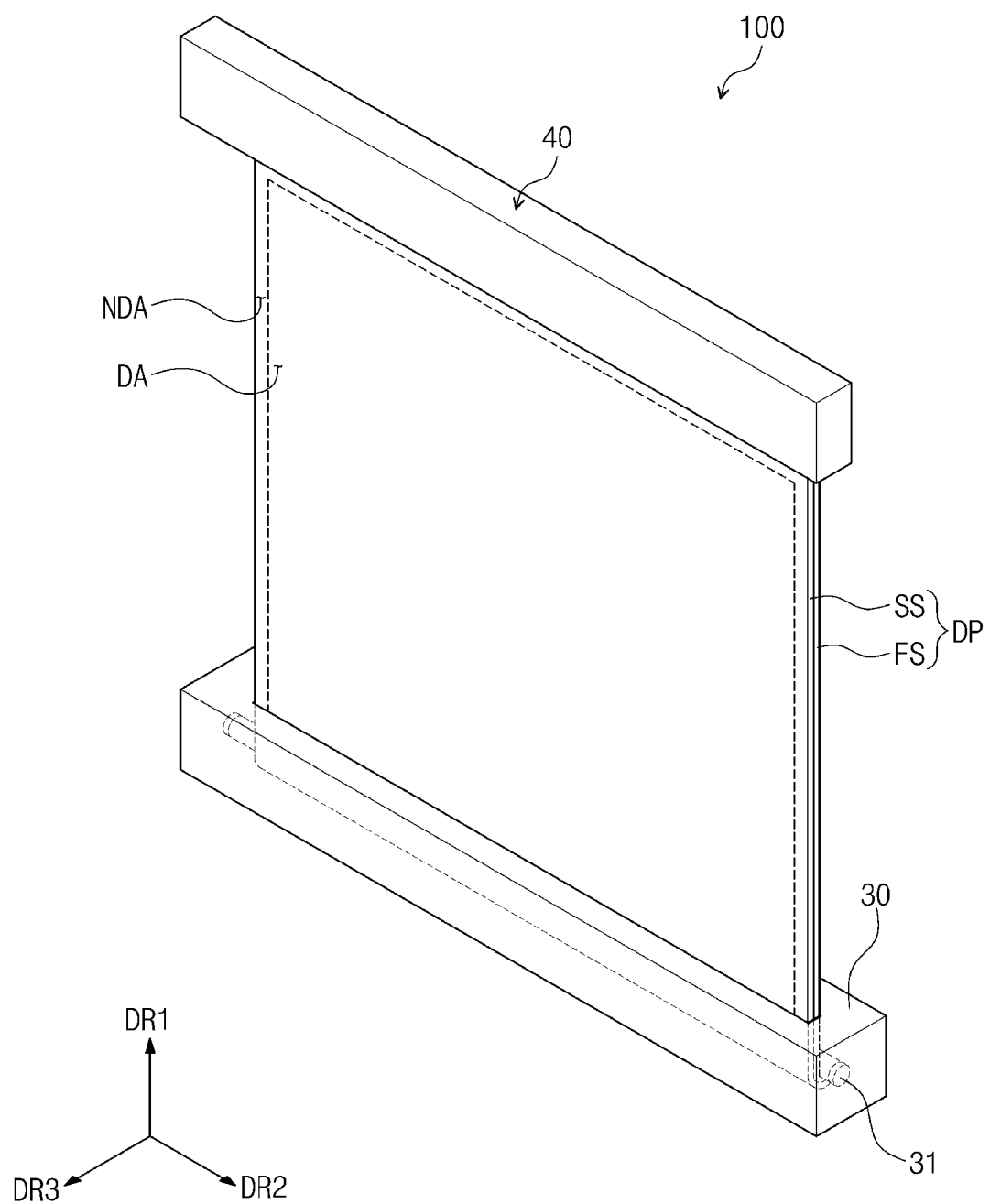
FIG. 1 is a perspective view of a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2B:
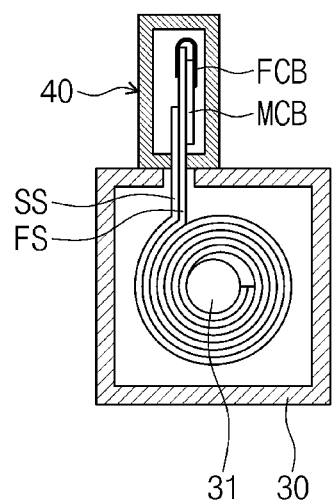
FIG. 2B is a cross-sectional view of a display device in a standby state.
Figure 3:
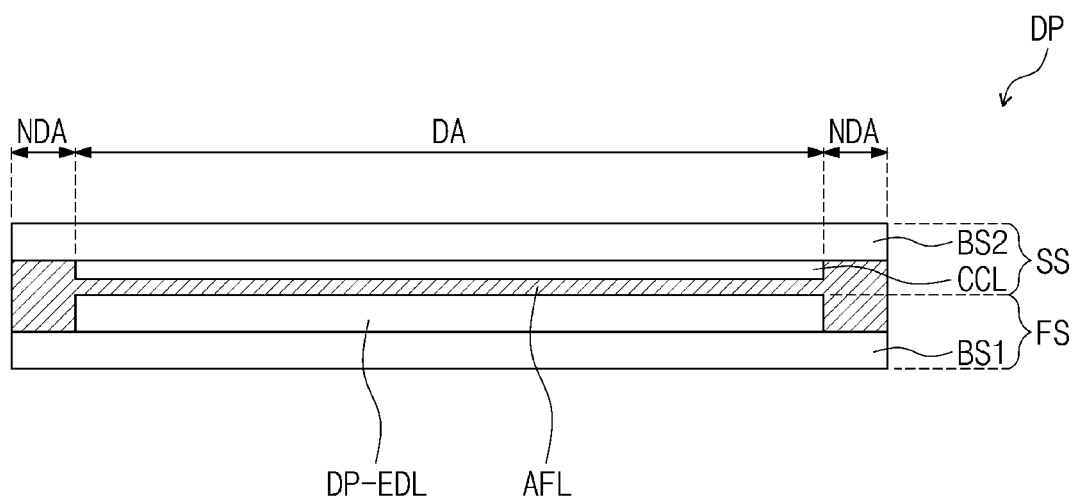
FIG. 3 is a cross-sectional view of a flexible display panel according to an exemplary embodiment.

FIG. 1 is a perspective view of a display device according to an exemplary embodiment, FIG. 2A is a cross-sectional view of a display device in an active state, FIG. 2B is a cross-sectional view of a display device in a standby state, and FIG. 3 is a cross-sectional view of a flexible display panel according to an exemplary embodiment.

Referring to FIG. 1, a display device 100 according to an exemplary embodiment may include a flexible display panel DP, a housing 30, in which a roller 31 is contained, and a fastening frame 40, which is coupled to a portion of the flexible display panel DP.

The flexible display panel DP may have an easily curved property, like paper, and may have a portion fixed to the roller 31, which may be wound around the roller 31. According to an exemplary embodiment, the flexible display panel DP may have substantially a rectangular shape that has a pair of sides parallel to a first direction DR1 and a pair of sides parallel to a second direction DR2 crossing the first direction DR1. However, the inventive concepts are not limited a particular shape of the flexible display panel DP, and the shape thereof may be variously changed.

A portion where a first side of the sides is positioned will be referred to as a first side portion of the flexible display panel DP, and a portion where a second side of the sides is positioned will be referred to as a second side portion of the flexible display panel DP. In particular, the first and second sides may be a pair of sides parallel to a second direction DR2. The first side portion of the flexible display panel DP may be fastened to the roller 31, and the second side portion of the flexible display panel DP may be fastened to the fastening frame 40.

As shown in FIG. 1, the flexible display panel DP may display an image on a display surface, which is parallel to the first direction DR1 and the second direction DR2. Hereinafter, a direction normal to this display surface will be referred to as a third direction DR3.

The flexible display panel DP may include a display region DA, which is used to display an image, and a non-display region NDA surrounding the display region DA. In particular, the display region DA may be a region displaying an image, and in this case, the image may be provided to a user through the display region DA. The display region DA may be substantially rectangular. The non-display region NDA may enclose the display region DA. Accordingly, the shape of the display region DA may be substantially defined by the non-display region NDA.

The non-display region NDA may be a region adjacent to the display region DA and may not display an image. However, the inventive concepts are not limited thereto, and in some exemplary embodiments, the non-display region NDA may be disposed near a portion of an edge of the display region DA.

Referring to FIGS. 1 and 3, the flexible display panel DP may be an organic light emitting display panel, for example. The flexible display panel DP may include a first substrate FS, a second substrate SS, and an adhesive filling layer AFL. The first and second substrates FS and SS may be coupled to each other by the adhesive filling layer AFL.

The first substrate FS may include a first base substrate BS1, in which the display region DA and the non-display region NDA adjacent to each other are defined, and a light emitting element layer DP-EDL, which includes a plurality of light emitting elements disposed in the display region DA of the first base substrate BS1. The second substrate SS may include a second base substrate BS2, which is disposed to face the first base substrate BS1, and a color conversion layer CCL, which is disposed on the second base substrate BS2 to correspond to each of the light emitting elements.

The adhesive filling layer AFL may be disposed in the display region DA, form a cell gap between the first substrate FS and the second substrate SS, and be disposed in the non-display region NDA to be in contact with the first and second base substrates BS1 and BS2. In this manner, the first and second base substrates BS1 and BS2 may be coupled to each other and be sealed.

According to an exemplary embodiment, the flexible display panel DP may further include an input sensing unit, which may sense a user input provided from the outside. The user input may include various types of external inputs, such as a part of a user's body, light, heat, or pressure.

Referring to FIGS. 1 to 2B, the roller 31 may be placed in the housing 30. The roller 31 may be configured to rotate in a clockwise or counter-clockwise direction. As shown in FIG. 2B, in a standby state, the flexible display panel DP may be wound around the roller 31 and may be contained in the housing 30. As shown in FIGS. 1 and 2A, in an active state, the flexible display panel DP may be unwound from the roller 31 and may be stretched. As such, a user HE may recognize an image displayed on the stretched flexible display panel DP.

A rotation direction of the roller 31 during winding the flexible display panel DP around the roller 31 may be opposite to a rotation direction of the roller 31 during unwinding the flexible display panel DP. In particular, if the roller 31 is rotated in the clockwise direction during winding the flexible display panel DP around the roller 31, the roller 31 may be rotated in the counter-clockwise direction when the flexible display panel DP is unwound from the roller 31.

According to an embodiment, the display device 100 may further include an additional mechanical part, which is used to automatically unwound the flexible display panel DP wound around the roller 31, and to support the flexible display panel DP in the unwound state and maintain the active state. For example, the mechanical part may be provided between the housing 30 and the fastening frame 40 and may be configured to lift the fastening frame 40 in an upward direction and to uniformly maintain a distance between the housing 30 and the fastening frame 40 when the fastening frame 40 is placed at a maximally lifted position.

The fastening frame 40 may include an accommodation space, in which the second side portion of the flexible display panel DP can be accommodated. In some exemplary embodiments, fastening members that may fasten the flexible display panel DP to the fastening frame 40 may be further disposed in the accommodation space.

The display device 100 may further include a driving circuit unit coupled to the second side of the flexible display panel DP. The driving circuit unit may include a flexible circuit board FCB disposed on the first substrate FS of the flexible display panel DP, and a main circuit board MCB coupled to the flexible circuit board FCB. The flexible circuit board FCB may be attached to a portion of the non-display region NDA of the first substrate FS (e.g., a pad region provided with pads), and the main circuit board MCB may be disposed on a rear surface of the first substrate FS.

In some exemplary embodiments, the driving circuit unit may further include a driving chip mounted on the flexible circuit board FCB. The flexible circuit board FCB may be connected to the main circuit board MCB. The main circuit board MCB and the flexible circuit board FCB may be formed of a flexible film.

FIGS. 2A and 2B exemplarily illustrate that the driving circuit unit includes two circuit boards FCB and MCB, however, the inventive concepts are not limited thereto. For example, in some exemplary embodiments, the driving circuit unit may include only the flexible circuit board FCB.

Figure 4A:
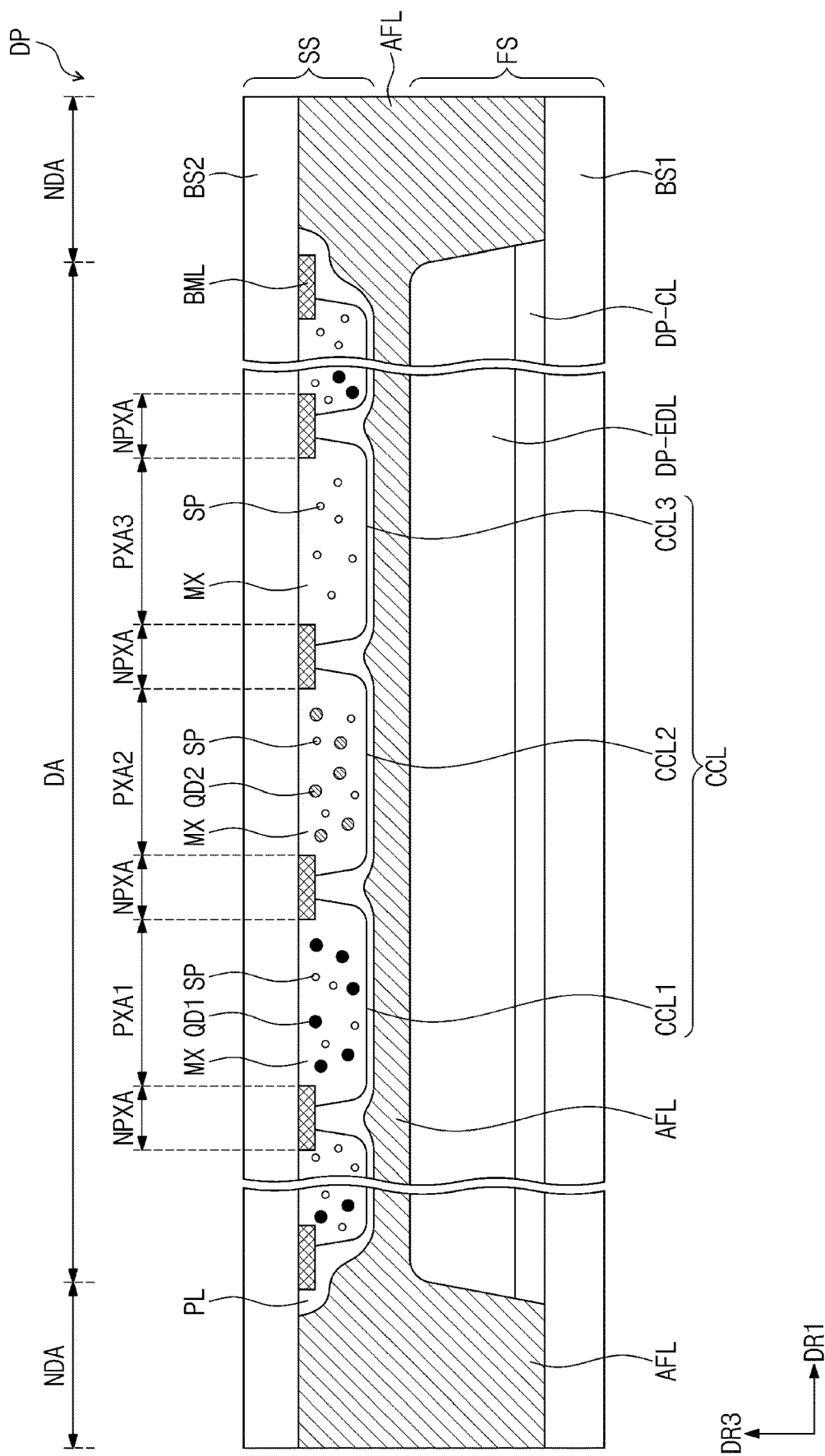
FIGS. 4A, 4B, and 4C are enlarged cross-sectional views of flexible display panels according to exemplary embodiments.
Figure 4B:
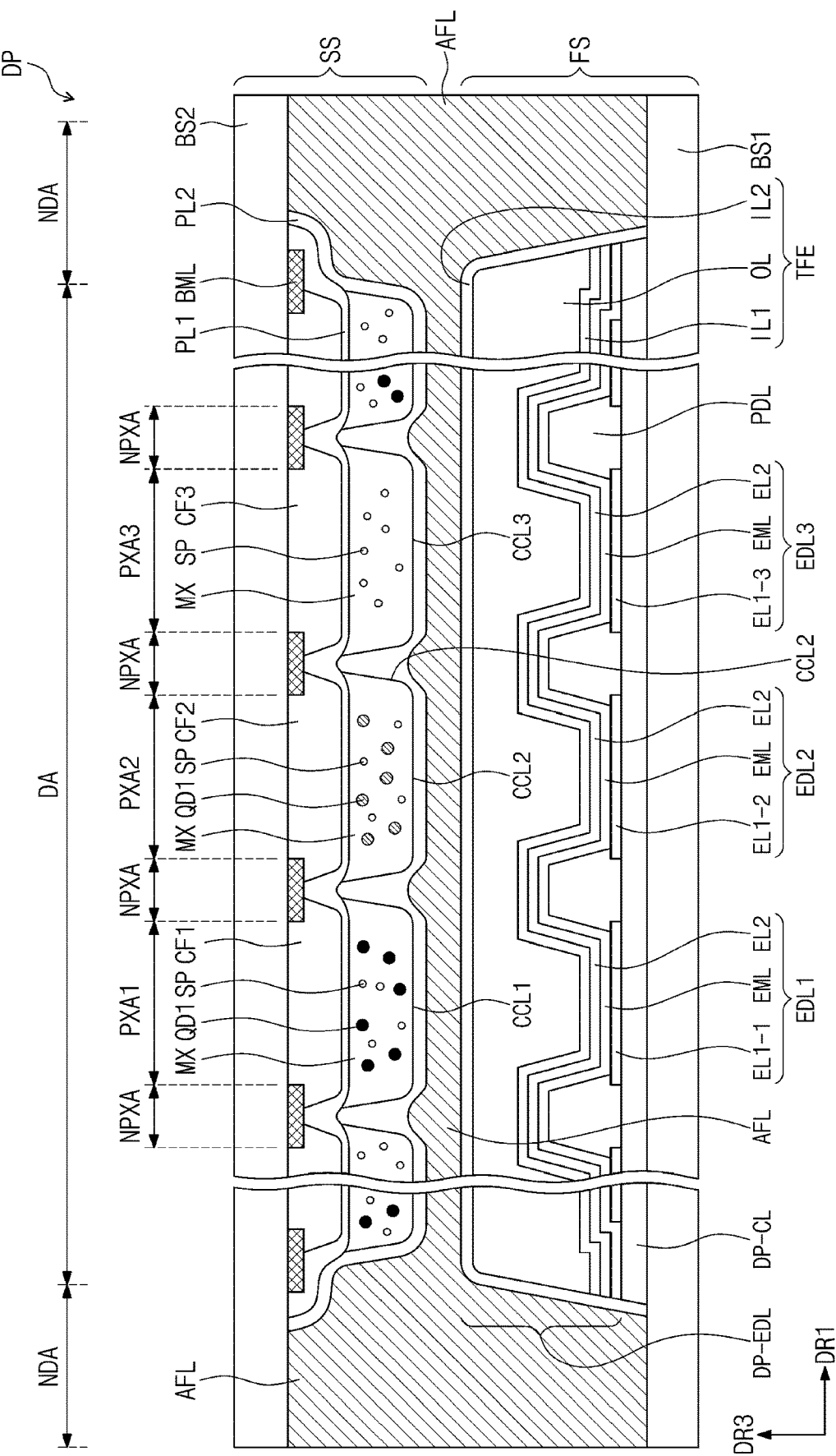
Figure 4C:
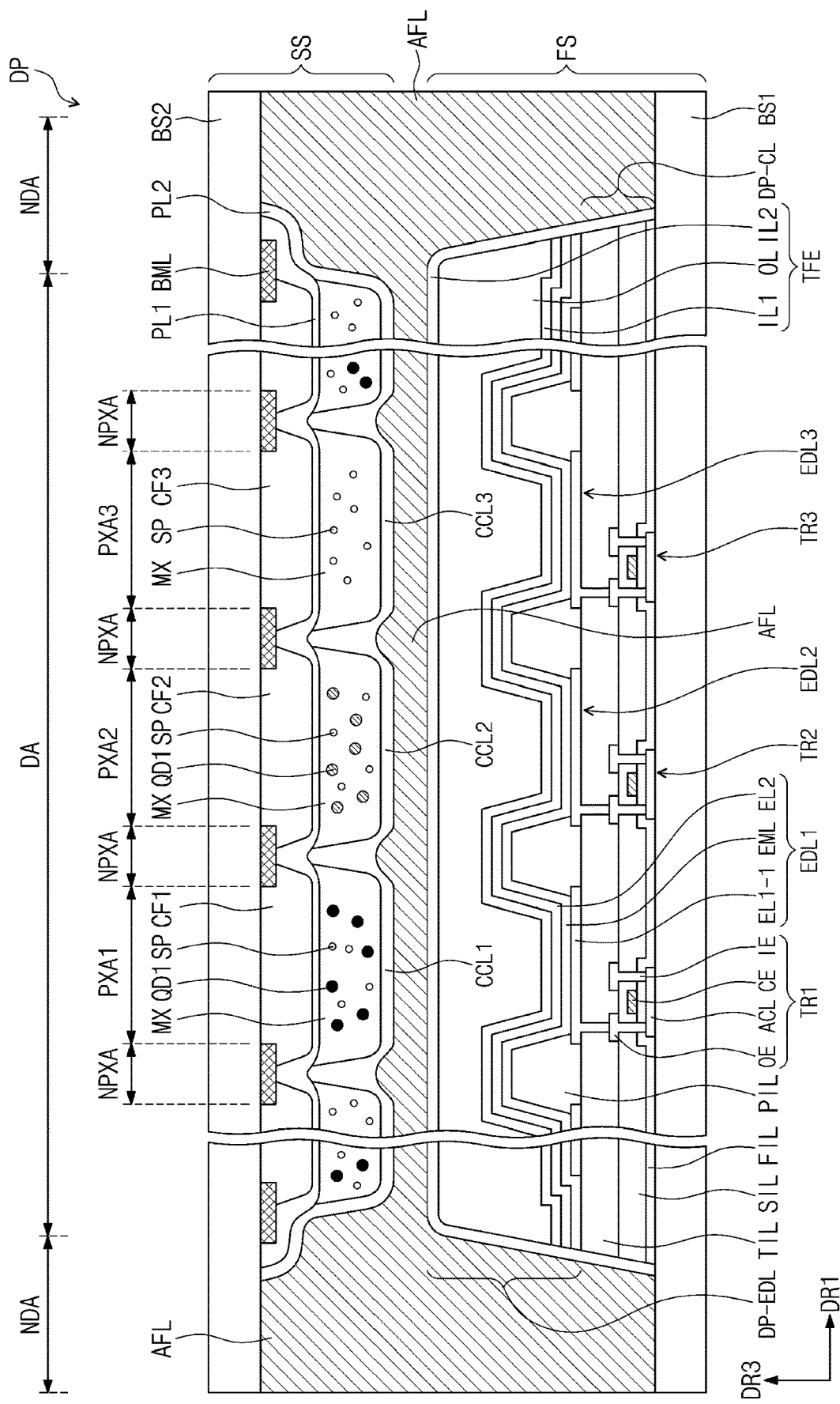

FIGS. 4A to 4C are enlarged cross-sectional views of flexible display panels according to exemplary embodiments.

Referring to FIG. 4A, first pixel regions PXA1, second pixel regions PXA2, third pixel regions PXA3, and a non-pixel region NPXA may be defined in the display region DA of the flexible display panel DP. Each of the first pixel regions PXA1 may be configured to provide a second color light, each of the second pixel regions PXA2 may be configured to provide a third color light, and each of the third pixel regions PXA3 may be configured to provide a first color light. The first, second, and third color lights may be light with different colors. For example, one of the first to third color lights may be blue light, and another may be red light, and the other may be green light.

The non-pixel region NPXA may be a region adjacent to the first pixel regions PXA1, the second pixel regions PXA2, and the third pixel regions PXA3. The non-pixel region NPXA may delimit the first pixel regions PXA1, the second pixel regions PXA2, and the third pixel regions PXA3. The non-pixel region NPXA may be provided to prevent a color-mixing between the first pixel regions PXA1, the second pixel regions PXA2, and the third pixel regions PXA3.

The first substrate FS of the flexible display panel DP may include the first base substrate BS1, a display circuit layer DP-CL, and the light emitting element layer DP-EDL. According to an exemplary embodiment, the first base substrate BS1, the display circuit layer DP-CL, and the light emitting element layer DP-EDL may be sequentially stacked in the third direction DR3.

The first base substrate BS1 may be a member providing a base surface, on which is the display circuit layer DP-CL is disposed. The first base substrate BS1 may be a glass substrate, a metal substrate, a plastic substrate, or the like. However, the inventive concepts are not limited to, and in some exemplary embodiments, the first base substrate BS1 may be an inorganic layer, an organic layer, or a layer made of a composite material.

The display circuit layer DP-CL may be disposed on the first base substrate BS1. The display circuit layer DP-CL may include a plurality of transistors. Each of the transistors may include a control electrode, an input electrode, and an output electrode. For example, the display circuit layer DP-CL may include switching and driving transistors, which are used to drive an organic electroluminescent device.

The light emitting element layer DP-EDL may be disposed on the display circuit layer DP-CL. The light emitting element layer DP-EDL may include a plurality of organic electroluminescent elements and an encapsulation layer covering the organic electroluminescent elements. According to an exemplary embodiment, the light emitting element layer DP-EDL may include a light emitting layer EML (e.g., see FIG. 4B) emitting a first color light. The first color light may be blue light. The light emitting layer EML may be a common layer, which is provided in common in the plurality of organic electroluminescent elements. For example, each of the organic electroluminescent elements may emit the first color light through the light emitting layer EML.

The second substrate SS of the flexible display panel DP may include the second base substrate BS2, the color conversion layer CCL, a light-blocking layer BML, and a protection layer PL.

The second base substrate BS2 may be disposed to be opposite to the first base substrate BS1. The second base substrate BS2 may be a glass substrate, a metal substrate, a plastic substrate, or the like. For example, the first and second base substrates BS1 and BS2 may include the same material. However, the inventive concepts are not limited thereto, and in some exemplary embodiments, the second base substrate BS2 may include an inorganic layer, an organic layer, or a layer made of a composite material.

The color conversion layer CCL may include an optical converter. The optical converter may be a quantum dot, a fluorescent, a phosphorescent body, or the like. The optical converter may change a wavelength of light incident thereto, and may emit light having the changed wavelength. In particular, the color conversion layer CCL may be a layer including at least one or more of quantum dots, fluorescent, and phosphorescent bodies.

The color conversion layer CCL may include a plurality of color conversion layers CCL1, CCL2, and CCL3. The plurality of color conversion layers CCL1, CCL2, and CCL3 may be spaced apart from each other in the first direction DR1 and the second direction DR2 (see FIG. 1).

The light-blocking layer BML may be disposed between the color conversion layers CCL1, CCL2, and CCL3 spaced apart from each other, but the inventive concepts are not limited thereto. In some exemplary embodiments, the light-blocking layer BML may be overlapped with edge regions of the color conversion layers CCL1, CCL2, and CCL3. The light-blocking layer BML may be a black matrix. The light-blocking layer BML may include an organic or inorganic light blocking material including a black pigment or dye. The light-blocking layer BML may prevent a light leakage phenomenon, and may delimit the color conversion layers CCL1, CCL2, and CCL3 adjacent to each other.

The color conversion layers CCL1, CCL2, and CCL3 may include a first color conversion layer CCL1, which converts the first color light provided from the light emitting element layer DP-EDL to the second color light, a second color conversion layer CCL2, which converts the first color light to the third color light, and a third color conversion layer CCL3, which transmits the first color light. The first color conversion layer CCL1 may correspond to the first pixel region PXA1, the second color conversion layer CCL2 may correspond to the second pixel region PXA2, and the third color conversion layer CCL3 may correspond to the third pixel region PXA3.

According to an exemplary embodiment, the first color conversion layer CCL1 may provide red light, which is the second color light, and the second color conversion layer CCL2 may provide green light, which is the third color light. The third color conversion layer CCL3 may transmit and provide blue light, which is the first color light provided from the light emitting element layer DP-EDL.

The first color conversion layer CCL1 may include a matrix portion MX and first quantum dots QD1 dispersed in the matrix portion MX. The first color conversion layer CCL1 may further include light scattering agent SP dispersed in the matrix portion MX. The second color conversion layer CCL2 may include the matrix portion MX and second quantum dots QD2 dispersed in the matrix portion MX, and may further include the light scattering agent SP. For example, the first quantum dot QD1 may be red quantum dot, and the second quantum dot QD2 may be green quantum dot. In addition, the third color conversion layer CCL3 may include the matrix portion MX and the light scattering agent SP.

The matrix portion MX may be a medium, in which the quantum dots QD1 and QD2 or the light scattering agent SP are dispersed, and may be formed of various resin compositions that are generally referred to as binders. According to an exemplary embodiment, the matrix portion MX may include a polymer resin composition. For example, the polymer resin composition for the matrix portion MX may include acrylic resins, urethane resins, silicone resins, epoxy resins, or the like. The polymer resin composition according to an exemplary embodiment may be transparent.

The quantum dots QD1 and QD2 may be particles that the wavelength of light provided from the light emitting layer EML. The quantum dots QD1 and QD2 may be a nanometer-order crystalline material consisting of hundreds to thousands of atoms, and due to their small size, the quantum dots QD1 and QD2 may exhibit the quantum confinement effect to increase a band gap. When an energy of light incident to the quantum dots QD1 and QD2 is greater than a band gap of each of the quantum dots QD1 and QD2, each of the quantum dots QD1 and QD2 may absorb light and become in an excited state, and then, may emit light of a specific wavelength while returning to its ground state. The wavelength of the emitted light may be determined by the band gap. In particular, by adjusting sizes or compositions of the quantum dots QD1 and QD2, the quantum confinement effect and the consequent light-emitting characteristics may be controlled. Color of light emitted from the quantum dot QD1 or QD2 may be changed depending on its particle size. For example, as the particle size of the quantum dot QD1 or QD2 is smaller, the wavelength of light emitted therefrom may be shorter. For example, the second quantum dot QD2 emitting the green light may have a particle size that is smaller than a particle size of the first quantum dot QD1 emitting the red light.

The cores of the quantum dots QD1 and QD2 may be selected from the group consisting of II-VI compounds, III-V compounds, IV-VI compounds, IV elements, IV compounds, and combination thereof.

The II-VI compounds may be selected from the group consisting of binary compounds (e.g., including CdSe, CdTe, CdS, ZnS, ZnSe, ZnTe, ZnO, HgS, HgSe, HgTe, MgSe, and MgS), and a mixture thereof, ternary compounds (e.g., including AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and MgZnS), and a mixture thereof, quaternary compounds (e.g., including HgZnTeS, CdZnSeS, CdZnSeTe, CdZnSTe, CdHgSeS, CdHgSeTe, CdHgSTe, HgZnSeS, HgZnSeTe, and HgZnSTe), and a mixture thereof.

The Group compounds may be selected from ternary element compounds selected from the group consisting of $AgInS_2$, $CuInS_2$, $AgGaS_2$, $CuGaS_2$, and a combination thereof, and quaternary element compounds selected from the group consisting of $AgInGaS_2$ and $CuInGaS_2$.

The III-V compounds may be selected from the group consisting of binary compounds (e.g., including GaN, GaP, GaAs, GaSb, AlN, AlP, AlAs, AlSb, InN, InP, InAs, and InSb), and a mixture thereof, ternary compounds (e.g., including GaNP, GaNAs, GaNSb, GaPAs, GaPSb, AlNP, AlNAs, AlNSb, AlPAs, AlPSb, InGaP, InAlP, InNP, InNAs, InNSb, InPAs, and InPSb), and a mixture thereof, quaternary compounds (e.g., including GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and InAlPSb), and a mixture thereof. The Group III-V compounds may further comprise the Group II compounds. For example, the Group III-II-V compounds may be selected from InZnP.

The IV-VI compounds may be selected from the group consisting of binary compounds (e.g., including SnS, SnSe, SnTe, PbS, PbSe, and PbTe), and a mixture thereof, ternary compounds (e.g., including SnSeS, SnSeTe, SnSTe, PbSeS, PbSeTe, PbSTe, SnPbS, SnPbSe, and SnPbTe), and a mixture thereof, quaternary compounds (e.g., including SnPbSSe, SnPbSeTe, and SnPbSTe), and a mixture thereof. The IV elements may be selected from the group consisting of Si, Ge, and mixtures thereof. The IV compounds may include binary compounds selected from the group consisting of SiC, SiGe, and a mixture thereof.

The binary, ternary, or quaternary compound may have a uniform concentration throughout the particle, or may have a spatially varying concentration distribution in each particle.

The quantum dot QD1 or QD2 may have a core-shell structure including a core and a shell enclosing the core. In some exemplary embodiments, however, the quantum dot QD1 or QD2 may have a core-shell structure, in which a quantum dot is surrounded by another quantum dot. At an interface between the core and the shell, an element contained in the shell may have a decreasing concentration gradient along a central direction.

The quantum dot QD1 or QD2 may be a nanometer-scale particle. Each of the quantum dots QD1 and QD2 may have a light-emitting wavelength spectrum, in which full width half maximum (FWHM) is less than about 45 nm, less than about 40 nm, or less than about 30 nm, according to exemplary embodiments. In this case, color purity or color reproduction characteristics may be improved. Furthermore, the quantum dots QD1 and QD2 may emit light radially, and thus, a viewing angle property may be improved.

According to an exemplary embodiment, the quantum dots QD1 and QD2 may be substantially a spherical, pyramid-shaped, multi-arm, or cubic nano particle. In some exemplary embodiments, the quantum dots may be a nano tube, a nano wire, a nano fiber, a nano plate-shaped particle, without being limited thereto.

The light scattering agent SP according to an exemplary embodiment may be an inorganic particle. For example, the light scattering agent SP may include at least one of $TiO_2$, ZnO, $Al_2O_3$, $SiO_2$, and hollow silica, or a mixture thereof.

The color conversion layer CCL may be covered with the protection layer PL. The protection layer PL may prevent external moisture and/or oxygen (hereinafter, 'moisture/oxygen') from passing therethrough. The protection layer PL may prevent or at least suppress the color conversion layer CCL from being exposed to the moisture/oxygen.

The protection layer PL according to an exemplary embodiment may include at least one inorganic layer. For example, the protection layer PL may include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, a metal thin film having high optical transmittance, or the like. In addition, the protection layer PL may further include an organic layer. The protection layer PL may be formed as a single layer or a plurality of layers.

In the display region DA, the adhesive filling layer AFL may be interposed between the protection layer PL and the light emitting element layer DP-EDL to form a cell gap. In the non-display region NDA, the adhesive filling layer AFL may be in contact with the first and second base substrates BS1 and BS2. The first and second base substrates BS1 and BS2 may be coupled to each other by an adhesive property from the adhesive filling layer AFL. In addition, a space between the first and second base substrates BS1 and BS2 may be hermetically sealed by the adhesive filling layer AFL. The adhesive filling layer AFL may include an epoxy resin, for example.

According to an exemplary embodiment, the light emitting element layer DP-EDL may include a pixel definition layer PDL, a plurality of organic electroluminescent devices EDL1, EDL2, and EDL3, and an encapsulation layer TFE, as shown in FIG. 4B.

The pixel definition layer PDL may be a layer that defines a plurality of pixel regions PXA1 to PXA3 in the light emitting element layer DP-EDL. In particular, the pixel definition layer PDL have openings that correspond to the plurality of pixel regions PXA1 to PXA3, and a region where the pixel definition layer PDL is provided may be defined as the non-pixel region NPXA.

The pixel definition layer PDL may be formed of a polymer resin. For example, the pixel definition layer PDL may include at least one of polyacrylate resins or polyimide resins. In an exemplary embodiment, the pixel definition layer PDL may further include an inorganic material, in addition to the polymer resin. Alternatively, the pixel definition layer PDL may include a light absorption material, a black pigment, or a black dye. When the pixel definition layer PDL includes the black or black dye, a black pixel definition layer may be formed. The carbon black or the like may be used as black or black dye of the pixel definition layer PDL, but the inventive concepts are not limited thereto.

The plurality of the organic electroluminescent devices EDL1, EDL2, and EDL3 may be provided to correspond to the pixel regions, respectively. The organic electroluminescent devices EDL1, EDL2, and EDL3 may include first electrodes EL1-1, EL1-2, and EL1-3, respectively. The first electrodes EL1-1, EL1-2, and EL1-3 may be provided to correspond to the pixel regions, respectively, and may be spaced apart from the first electrodes of other pixel regions adjacent thereto. The first electrodes EL1-1, EL1-2, and EL1-3 provided in the pixel regions PXA1 to PXA3 may form a first electrode layer EL1, which is formed on the display circuit layer DP-CL. Each of the first electrodes EL1-1, EL1-2, and EL1-3 may be exposed through the opening of the pixel definition layer PDL.

The first electrodes EL1-1, EL1-2, and EL1-3 may be formed of a metal alloy or a conductive compound. According to an exemplary embodiment, the first electrodes EL1-1, EL1-2, and EL1-3 may be anodes. In some exemplary embodiments, the first electrodes EL1-1, EL1-2, and EL1-3 may be pixel electrodes.

In each organic electroluminescent device EDL according to an exemplary, the first electrodes EL1-1, EL1-2, and EL1-3 may be reflective electrodes. However, the inventive concepts are not limited thereto. For example, in some exemplary embodiments, the first electrodes EL1-1, EL1-2, and EL1-3 may be transparent or transflective electrodes. When the first electrodes EL1-1, EL1-2, and EL1-3 are the transflective or reflective electrodes, the first electrodes EL1-1, EL1-2, and EL1-3 may include at least one of Ag, Mg, Cu, Al, Pt, Pd, Au, Ni, Nd, Ir, Cr, Li, Ca, LiF/Ca, LiF/Al, Mo, Ti, compounds thereof, or mixtures thereof (e.g., a mixture of Ag and Mg). Alternatively, the first electrodes EL1-1, EL1-2, and EL1-3 may have a multi-layered structure including a reflective or transflective layer and a transparent conductive layer, such as indium tin oxide (ITO), indium zinc oxide (IZO), zinc oxide (ZnO), or indium tin zinc oxide (ITZO). For example, the first electrodes EL1-1, EL1-2, and EL1-3 may be a multiple metal layer and may have a structure, in which metal layers of ITO/Ag/ITO are stacked.

Each of the organic electroluminescent devices EDL1, EDL2, and EDL3 may further include a light emitting layer EML and a second electrode EL2.

The light emitting layer EML may have a single-layered structure made of a single material, a single-layered structure made of a plurality of different materials, or a multi-layered structure including a plurality of layers made of a plurality of different materials.

The light emitting layer EML may emit the first color light. According to an exemplary embodiment, the light emitting layer EML may include a fluorescent material or a phosphorescent material. However, the inventive concepts are not limited thereto, and in some exemplary embodiments, the light emitting layer EML may include materials well known in the art. In addition, the light emitting layer EML may include a host and a dopant. As shown in FIGS. 4B and 4C, the light emitting layer EML may be provided as a common layer, which is formed throughout the first to third pixel regions PXA1 to PXA3.

A hole transport region may be provided between the light emitting layer EML and the first electrodes EL1-1, EL1-2, and EL1-3. The hole transport region may include a hole transport layer and a hole injection layer.

The second electrode EL2 may be provided on the light emitting layer EML. The second electrode EL2 may be a common electrode or a cathode. The second electrode EL2 may be formed of a metal alloy or a conductive compound. The second electrode EL2 may be a transparent electrode, a transflective electrode, or a reflective electrode. When the second electrode EL2 is the transparent electrode, the second electrode EL2 may be formed of a transparent metal oxide, such as indium tin oxide (ITO), indium zinc oxide (IZO), zinc oxide (ZnO), or indium tin zinc oxide (ITZO).

When the second electrode EL2 is the transflective or reflective electrode, the second electrode EL2 may include at least one of Ag, Mg, Cu, Al, Pt, Pd, Au, Ni, Nd, Ir, Cr, Li, Ca, LiF/Ca, LiF/Al, Mo, Ti, compounds thereof, or mixtures thereof (e.g., a mixture of Ag and Mg). Alternatively, the second electrode EL2 may be a multi-layered structure including a reflective or transflective layer and a transparent conductive layer, such as indium tin oxide (ITO), indium zinc oxide (IZO), zinc oxide (ZnO), or indium tin zinc oxide (ITZO).

As shown in FIG. 4B, the second electrode EL2 may be provided as a common layer, which is formed throughout the first to third pixel regions PXA1 to PXA3.

An electron transport region may be provided between the second electrode EL2 and the light emitting layer EML. The electron transport region may include at least one of a hole blocking layer, an electron transport layer, or an electron injection layer, but the inventive concepts are not limited thereto. When the electron transport region includes the electron injection layer and the electron transport layer, at least one of known electron injection materials and at least one of known electron transport materials may be used in the electron injection layer and the electron transport layer, respectively.

The encapsulation layer TFE may be disposed on the organic electroluminescent devices EDL1 to EDL3. The encapsulation layer TFE may cover the organic electroluminescent devices EDL1 to EDL3. In particular, the organic electroluminescent devices EDL1 to EDL3 may be hermetically sealed by the encapsulation layer TFE.

In some exemplary embodiments, the encapsulation layer TFE may include a first inorganic layer ILL an organic layer OL, and a second inorganic layer IL2, which are sequentially stacked. The organic layer OL may be disposed between the first inorganic layer IL1 and the second inorganic layer IL2. The first inorganic layer IL1 and the second inorganic layer IL2 may be formed by depositing an inorganic material, and the organic layer OL may be formed by depositing, printing, or coating an organic material.

The first inorganic layer IL1 and the second inorganic layer IL2 may protect the plurality of the organic electroluminescent devices EDL1 to EDL3 from moisture and oxygen, and the organic layer OL may protect the plurality of the organic electroluminescent devices EDL1 to EDL3 from a contamination material, such as dust particles. The first inorganic layer IL1 and the second inorganic layer IL2 may include at least one of silicon nitride, silicon oxynitride, silicon oxide, titanium oxide, or aluminum oxide. The organic layer OL may include at least one of polymers, such as an acryl-based organic layer. However, the inventive concepts are not limited thereto.

FIG. 4B exemplarily illustrates that the encapsulation layer TFE includes two inorganic layers and one organic layer, but the inventive concepts are not limited thereto. For example, the encapsulation layer TFE may include three inorganic layers and two organic layers, and in this case, the inorganic layers and the organic layers may be alternately stacked in the encapsulation layer TFE.

In the flexible display panel DP according to an exemplary embodiment, a second substrate SS2 may include a second base substrate BS2, color filter layers CF1, CF2, CF3, the light-blocking layer BML, a first protection layer PL1, the color conversion layer CCL, and a second protection layer PL2.

The color filter layers CF1 to CF3 may include a first color filter layer CF1 provided to correspond to the first color conversion layer CCL1, a second color filter layer CF2 provided to correspond to the second color conversion layer CCL2, and a third color filter layer CF3 provided to correspond to the third color conversion layer CCL3. The first color filter layer CF1 may be a red filter layer, the second color filter layer CF2 may be a green filter layer, and the third color filter layer CF3 may be a blue filter layer.

Each of the first to third color filter layers CF1, CF2, and CF3 may include a polymer photo-sensitive resin and a pigment or dye. The first color filter layer CF1 may include red pigment or dye, the second color filter layer CF2 may include green pigment or dye, and the third color filter layer CF3 may include blue pigment or dye.

However, the inventive concepts are not limited thereto, and in some exemplary embodiments, the third color filter layer CF3 may not include the pigment or dye. For example, the third color filter layer CF3 may include the polymer photo-sensitive resin, but may not include the pigment or dye. The third color filter layer CF3 may be transparent. For example, the third color filter layer CF3 may be formed of a transparent photo-sensitive resin.

The light-blocking layer BML may be disposed between the first to third color filter layers CF1 to CF3, which are spaced apart from each other, but the inventive concepts are not limited thereto. In some exemplary embodiments, the light-blocking layer BML may be overlapped with edge regions of the first to third color filter layers CF1 to CF3. The light-blocking layer BML may be a black matrix. The light-blocking layer BML may include an organic or inorganic light blocking material including a black pigment or dye. The light-blocking layer BML may prevent a light leakage phenomenon, and may delimit the first to third color filter layers CF1 to CF3 adjacent to each other.

The second base substrate BS2 may be disposed on the light-blocking layer BML and the first to third color filter layers CF1 to CF3. The second base substrate BS2 may be a member providing a base surface, on which the light-blocking layer BML, the first to third color filter layers CF1 to CF3, the first to third color conversion layers CCL1 to CCL3, and the first and second protection layers PL1 and PL2 may be disposed. The second base substrate BS2 may be a glass substrate, a metal substrate, a plastic substrate, or the like. However, the inventive concepts are not limited thereto, and in some exemplary embodiments, the second base substrate BS2 may be an inorganic layer, an organic layer, or a layer made of a composite material.

The first protection layer PL1 may be disposed on the color filter layers CF1 to CF3 and the light-blocking layer BML. The color conversion layers CCL1 to CCL3 may be provided on the first protection layer PL1. The color conversion layers CCL1 to CCL3 may have the same structure as the color conversion layers CCL1 to CCL3 shown in FIG. 4A. The second protection layer PL2 may be disposed on the color conversion layers CCL1 to CCL3.

The first protection layer PL1 may prevent external moisture/oxygen from passing therethrough. The first protection layer PL1 may prevent or at least suppress the color conversion layer CCL from being exposed to the moisture/oxygen.

The first and second protection layers PL1 and PL2 may include at least one inorganic layer. In particular, the first and second protection layers PL1 and PL2 may include an inorganic material. For example, the first and second protection layers PL1 and PL2 may include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, a metal thin film having high optical transmittance, or the like. In addition, at least one of the first and second protection layers PL1 and PL2 may further include an organic layer. Each of the first and second protection layers PL1 and PL2 may be formed as a single layer or a plurality of layers. In some exemplary embodiments, at least one of the first and second protection layers PL1 and PL2 may be omitted.

Referring to FIG. 4C, the display circuit layer DP-CL according to an exemplary embodiment may include first to third transistors TR1, TR2, and TR3 and a plurality of insulating layers FIL, SIL, and TIL. The insulating layers FIL, SIL, and TIL may include a first insulating layer FIL, a second insulating layer SIL, and a third insulating layer TIL.

The first to third transistors TR1, TR2, and TR3 may be disposed on the first base substrate BS1. The first to third transistors TR1, TR2, and TR3 may have substantially the same structure. As such, the first transistor TR1 will be described exemplarily. The first transistor TR1 may include a control electrode CE, an input electrode IE, an output electrode OE, and a semiconductor layer ACL.

The semiconductor layer ACL may be disposed on the first base substrate BS1. In some exemplary embodiments, a buffer layer may be further interposed between the first base substrate BS1 and the semiconductor layer ACL. The buffer layer may include a light-blocking material for blocking an external light from being incident into the semiconductor layer ACL through the first base substrate BS1.

The semiconductor layer ACL may include poly silicon or amorphous silicon. In some exemplary embodiments, the semiconductor layer ACL may include a metal oxide semiconductor. The semiconductor layer ACL may include a channel region, which may be used as a conduction path of electrons or holes, and a first doped region and a second doped region spaced apart from each other with the channel region interposed therebetween.

The first insulating layer FIL may be disposed on the first base substrate B S1 to cover the semiconductor layer ACL. The first insulating layer FIL may include an inorganic material. The inorganic material may include at least one of silicon nitride, silicon oxynitride, silicon oxide, titanium oxide, or aluminum oxide.

The control electrode CE may be disposed on the first insulating layer FIL. The second insulating layer SIL may be disposed on the first insulating layer FIL to cover the control electrode CE. The second insulating layer SIL may be formed as a single layer or a plurality of layers. For example, the single layer may include an inorganic layer. The plurality of layers may include an organic layer and an inorganic layer.

The input electrode IE and the output electrode OE may be disposed on the second insulating layer SIL. The input electrode IE and the output electrode OE may be connected to the semiconductor layer ACL through penetration holes, which are formed to penetrate the first insulating layer FIL and the second insulating layer SIL.

The third insulating layer TIL may be disposed on the second insulating layer SIL to cover the input electrode IE and the output electrode OE. The third insulating layer TIL may be formed as a single layer or a plurality of layers. For example, the single layer may include an organic layer. The plurality of layers may include an organic layer and an inorganic layer. The third insulating layer TIL may be a planarization layer providing a flat top surface. The light emitting element layer DP-EDL may be disposed on the third insulating layer TIL.

Figure 5:
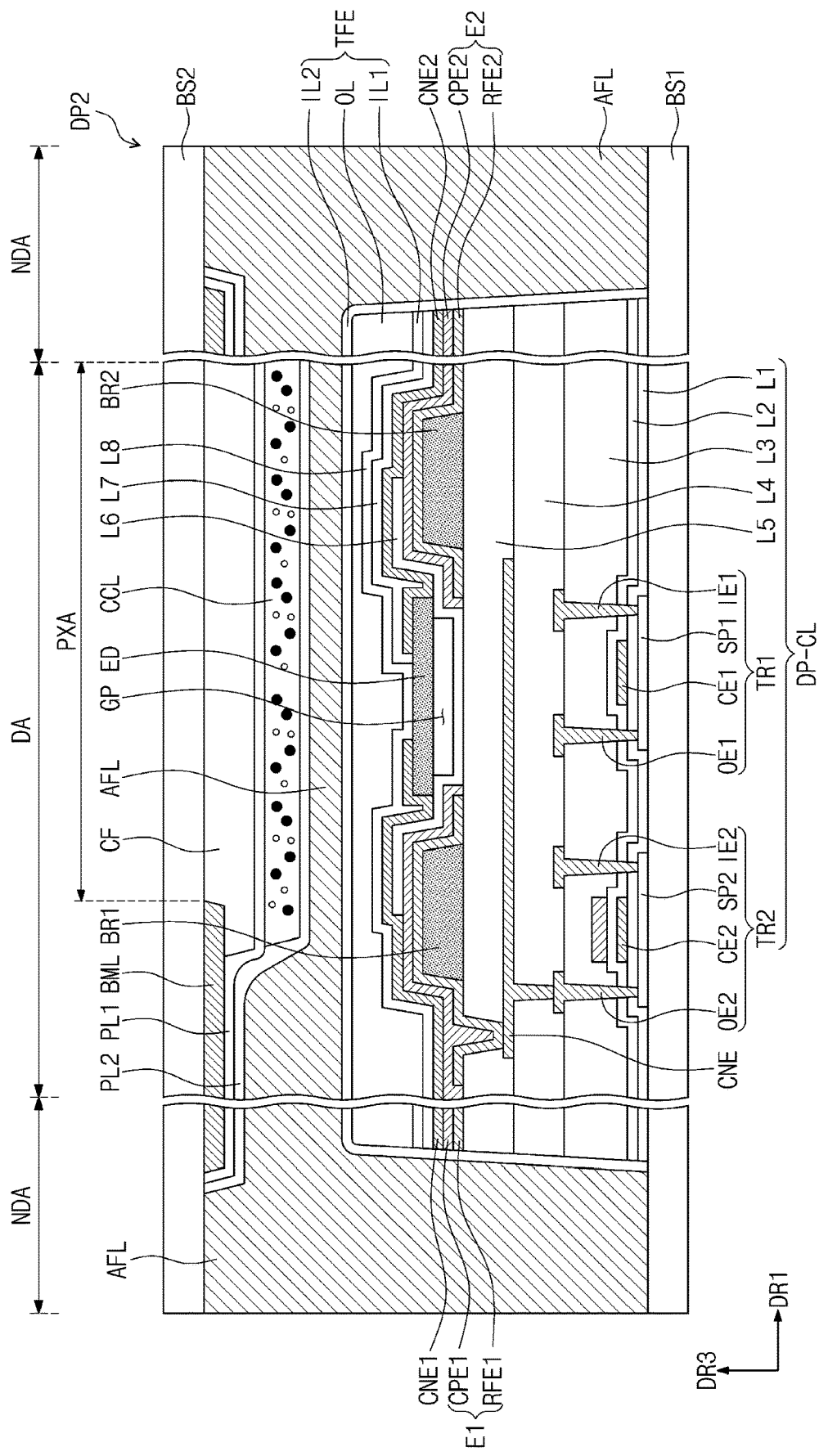
FIG. 5 is an enlarged cross-sectional view of a flexible display panel according to an exemplary embodiment.
Figure 6:
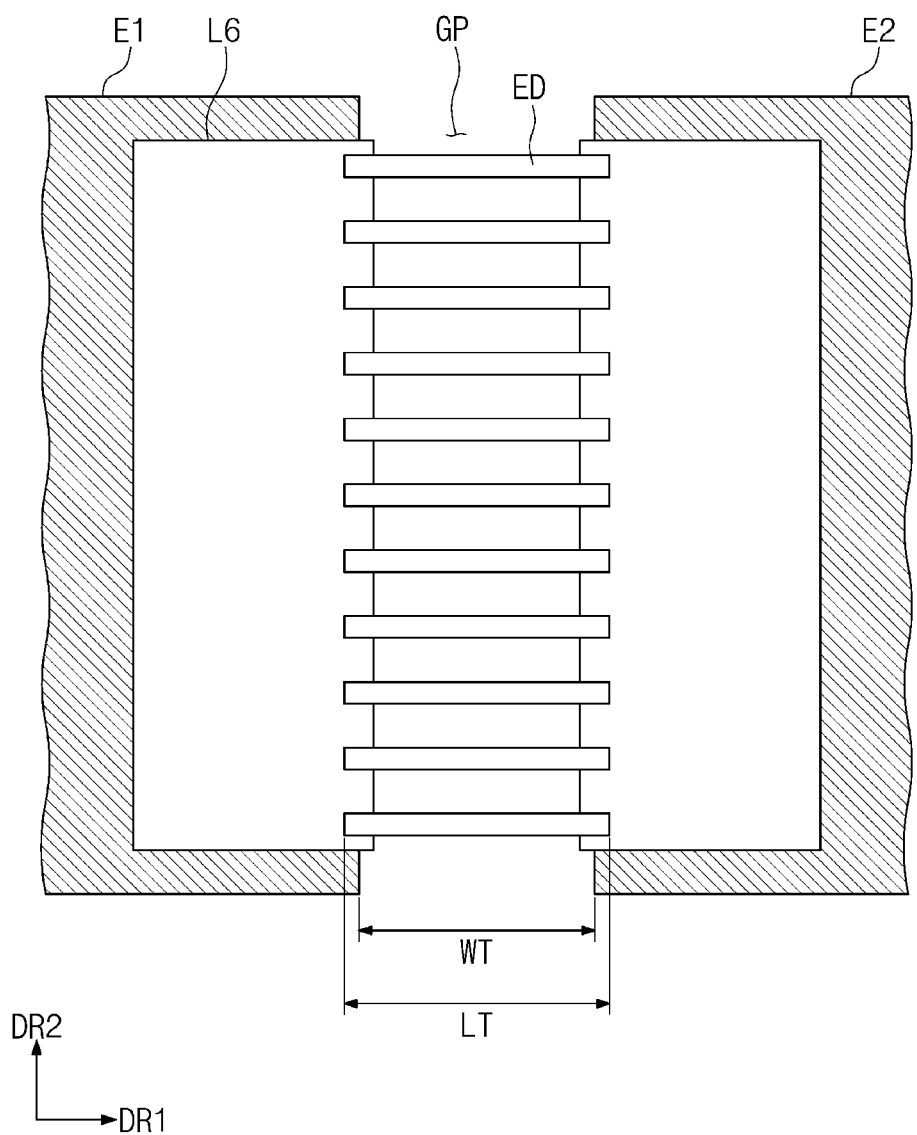
FIG. 6 is a plan view exemplarily illustrating a disposition of a light emitting element and first and second electrodes shown in FIG. 5.

FIG. 5 is an enlarged cross-sectional view of a flexible display panel according to an exemplary embodiment, and FIG. 6 is a plan view exemplarily illustrating a disposition of a light emitting element and first and second electrodes shown in FIG. 5.

Referring to FIGS. 5 and 6, a flexible display panel DP2 according to an exemplary embodiment may include the first base substrate BS1 and the second base substrate BS2. Each of the first base substrate BS1 and the second base substrate BS2 may be a glass substrate.

A circuit device layer DP-CL may be disposed on the first base substrate BS1. The display circuit layer DP-CL may include a first thin film transistor TR1, a second thin film transistor TR2, and a plurality of insulating layers L1 to L5. The first and second thin film transistors TR1 and TR2 and the structure of the insulating layer L1 to L5 are substantially similar to those of the display circuit layer DP-CL of FIG. 4C, and thus, repeated descriptions thereof will be omitted to avoid redundancy.

A first partitioning portion BR1 and a second partitioning portion BR2 may be disposed on a fifth insulating layer L5. As shown in FIG. 6, each of the first partitioning portion BR1 and the second partitioning portion BR2 may be extended in the second direction DR2. The second partitioning portion BR2 may be spaced apart from the first partitioning portion BR1 in the first direction DR1. The first partitioning portion BR1 and the second partitioning portion BR2 may include substantially the same material. For example, the first partitioning portion BR1 and the second partitioning portion BR2 may include an organic material.

A first electrode E1 may be disposed on the first partitioning portion BR1, and a second electrode E2 may be disposed on the second partitioning portion BR2. The first electrode E1 may be extended in the second direction DR2 to cover the first partitioning portion BR1, and the second electrode E2 may be extended in the second direction DR2 to cover the second partitioning portion BR2. More particularly, the first partitioning portion BR1 may be disposed between the first electrode E1 and the fifth insulating layer L5, and the second partitioning portion BR2 may be disposed between the second electrode E2 and the fifth insulating layer L5.

A penetration hole may be provided in the fifth insulating layer L5, and a portion of a connection electrode CNE may be exposed through the penetration hole. The first electrode E1 may be electrically connected to the exposed portion of the connection electrode CNE.

The first electrode E1 may include a first reflection electrode RFE1 and a first capping electrode CPE1, and the second electrode E2 may include a second reflection electrode RFE2 and a second capping electrode CPE2.

Each of the first reflection electrode RFE1 and the second reflection electrode RFE2 may include a reflective material. Each of the first reflection electrode RFE1 and the second reflection electrode RFE2 may have a single-layered structure or a multi-layered structure, in which a plurality of layers are stacked. For example, each of the first reflection electrode RFE1 and the second reflection electrode RFE2 may have a structure, in which indium tin oxide (ITO), silver (Ag), and indium tin oxide (ITO) are sequentially stacked.

The first capping electrode CPE1 may be disposed to cover the first reflection electrode RFE1, and the second capping electrode CPE2 may be disposed to cover the second reflection electrode RFE2. Each of the first capping electrode CPE1 and the second capping electrode CPE2 may include at least one of, for example, indium zinc oxide (IZO), indium tin oxide (ITO), indium gallium oxide (IGO), indium zinc gallium oxide (IGZO), of mixture/compound thereof.

A sixth insulating layer L6 may be disposed on the first electrode E1, the fifth insulating layer L5, and the second electrode E2, at least between the first and second partitioning portions BR1 and BR2. In particular, the sixth insulating layer L6 may be disposed on the fifth insulating layer L5, on the first capping electrode CPE1, and on the second capping electrode CPE2, in a region between the first and second capping electrodes CPE1 and CPE2. The sixth insulating layer L6 may be partially overlapped with the first capping electrode CPE1 and may be partially overlapped with the second capping electrode CPE2. For example, the sixth insulating layer L6 may be disposed on the first capping electrode CPE1 to be at least partially overlapped with the first partitioning portion BR1, and may be disposed on the second capping electrode CPE2 to be at least partially overlapped with the second partitioning portion BR2. However, the inventive concepts are not limited to a particular structure of the sixth insulating layer L6, and in some exemplary embodiments, the sixth insulating layer L6 may not overlap with the first and second partitioning portions BR1 and BR2.

A plurality of light emitting elements ED may be disposed on the sixth insulating layer L6. The plurality of light emitting elements ED may be connected in parallel. The plurality of light emitting elements ED may be aligned in the second direction DR2.

The light emitting elements ED may be electrically connected to the first electrode E1 and the second electrode E2. The light emitting elements ED may be disposed between the first electrode E1 and the second electrode E2. Each of the light emitting elements ED may be disposed to have two opposite ends, one of which is overlapped with the first electrode E1 and the other of which is overlapped with the second electrode E2.

A length LT of each of the light emitting elements ED may range from several nanometers to several hundreds of micrometers. For example, the length LT of each of the light emitting elements ED may range from about 1 micrometer to about 100 micrometers.

A distance WT between the first and second electrodes E1 and E2 in the first direction DR1 may be less than the length LT of each of the light emitting elements ED in the first direction DR1. In a region between the first and second electrodes E1 and E2, the light emitting elements ED may be spaced apart from the sixth insulating layer L6. Accordingly, a gap may be formed between the light emitting elements ED and the sixth insulating layer L6.

The light emitting elements ED may be electrically connected to the first electrode E1 through a first connection electrode CNE1, and may be electrically connected to the second electrode E2 through a second connection electrode CNE2.

The first connection electrode CNE1 may be disposed on the light emitting elements ED, the sixth insulating layer L6, and the first electrode E1. In particular, the first connection electrode CNE1 may be electrically connected to a portion of the first electrode E1 through a portion of the first capping electrode CPE1 exposed by the sixth insulating layer L6, for example.

The second connection electrode CNE2 may be disposed on the light emitting elements ED, the sixth insulating layer L6, and the second electrode E2. In particular, the second connection electrode CNE2 may be electrically connected to a portion of the second electrode E2 through a portion of the second capping electrode CPE2 exposed by the sixth insulating layer L6, for example.

A seventh insulating layer L7 may be disposed on the second connection electrode CNE2. Even when the light emitting elements ED is formed to be small to have a length equal to or less than several hundreds of micrometers, the second connection electrode CNE2 and the first connection electrode CNE1 may not be in direct contact with each other by the seventh insulating layer L7. However, the inventive concepts are not limited thereto, and in some exemplary embodiments, the first connection electrode CNE1 and the second connection electrode CNE2 may be concurrently formed through the same process. In this case, the seventh insulating layer L7 may be omitted.

The first connection electrode CNE1 and the second connection electrode CNE2 may include a conductive material. For example, the conductive material may include at least one of indium zinc oxide (IZO), indium tin oxide (ITO), indium gallium oxide (IGO), indium zinc gallium oxide (IGZO), or mixture/compound thereof. However, the inventive concepts are not limited thereto. For example, the conductive material may be a metallic material including molybdenum, silver, titanium, copper, aluminum, or alloys thereof.

The encapsulation layer TFE may be formed on the first connection electrode CNE1 and the seventh insulating layer L7. The encapsulation layer TFE may include the first inorganic layer ILL the organic layer OL, and the second inorganic layer IL2, which are sequentially stacked. The organic layer OL may be disposed between the first inorganic layer IL1 and the second inorganic layer IL2. The first inorganic layer IL1 and the second inorganic layer IL2 may be formed by depositing an inorganic material, and the organic layer OL may be formed by depositing, printing, or coating an organic material.

A light-blocking layer BML, a color filter layer CF, the color conversion layer CCL, and the first and second protection layers PL1 and PL2 may be disposed on a surface of the second base substrate BS2. The structure of the second base substrate BS2 may be substantially similar to that described above with reference to the FIGS. 4A to 4C, and thus, repeated descriptions thereof will be omitted.

In the display region DA, the adhesive filling layer AFL may be interposed between the second protection layer PL2 and the encapsulation layer TFE to form a cell gap. In the non-display region NDA, the adhesive filling layer AFL may be in contact with the first and second base substrates BS1 and BS2. The first and second base substrates BS1 and BS2 may be attached to each other by an adhesive property of the adhesive filling layer AFL. In addition, a space between the first and second base substrates BS1 and BS2 may be hermetically sealed by the adhesive filling layer AFL. The adhesive filling layer AFL may include an epoxy resin, for example.

In some exemplary embodiments, the adhesive filling layer AFL may be an optically clear adhesive (OCA) film, an optically clear resin (OCR) film, or a pressure sensitive adhesive (PSA) film.

FIGS. 7A to 7D are plan views illustrating a process of fabricating a flexible display panel of FIG. 3 according to an exemplary embodiment, and FIGS. 8A to 8F are cross-sectional views illustrating the process of fabricating a flexible display panel of FIG. 3 according to an exemplary embodiment.

Figure 7A:
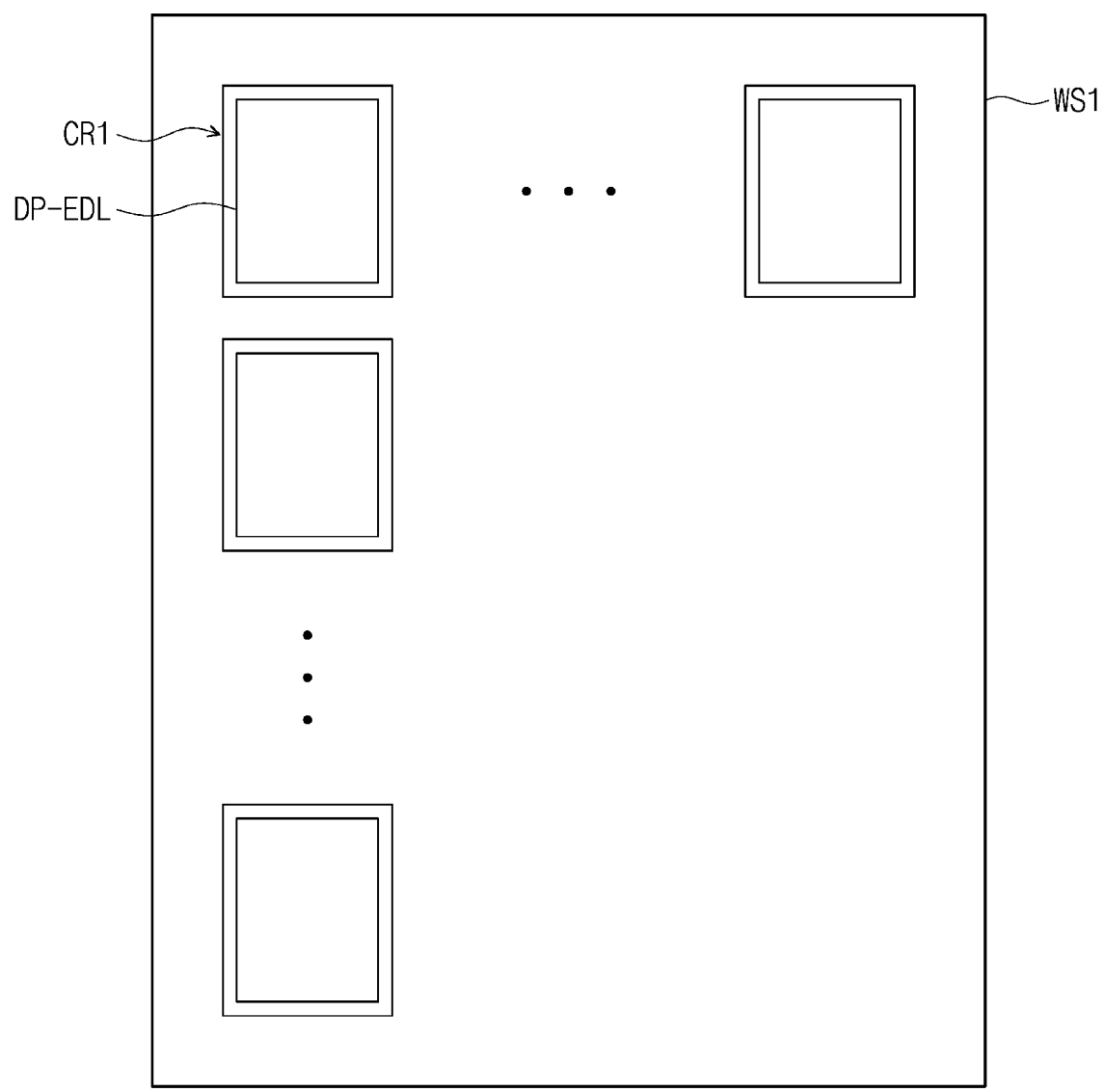
FIGS. 7A, 7B, 7C, and 7D are plan views illustrating a process of fabricating a flexible display panel of FIG. 3 according to an exemplary embodiment.
Figure 8A:
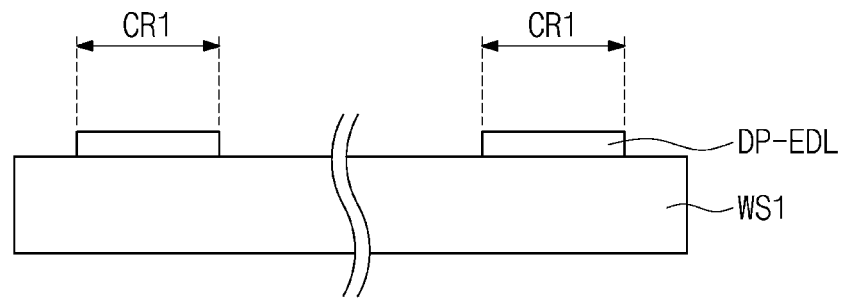
FIGS. 8A, 8B, 8C, 8D, 8E, and 8F are cross-sectional views illustrating a process of fabricating a flexible display panel of FIG. 3 according to an exemplary embodiment.

Referring to FIGS. 7A and 8A, a first working substrate WS1 may include a plurality of first cell regions CR1. Each of the first cell regions CR1 may be a region corresponding to the first base substrate BS1 of the display panel DP (e.g., see FIG. 3). The display circuit layer DP-CL, the light emitting element layer DP-EDL, and the encapsulation layer TFE may be sequentially formed on each of the first cell regions CR1 of the first working substrate WS1. Although only the light emitting element layer DP-EDL is illustrated in FIGS. 7A and 8A, the inventive concepts are not limited thereto.

Figure 7B:
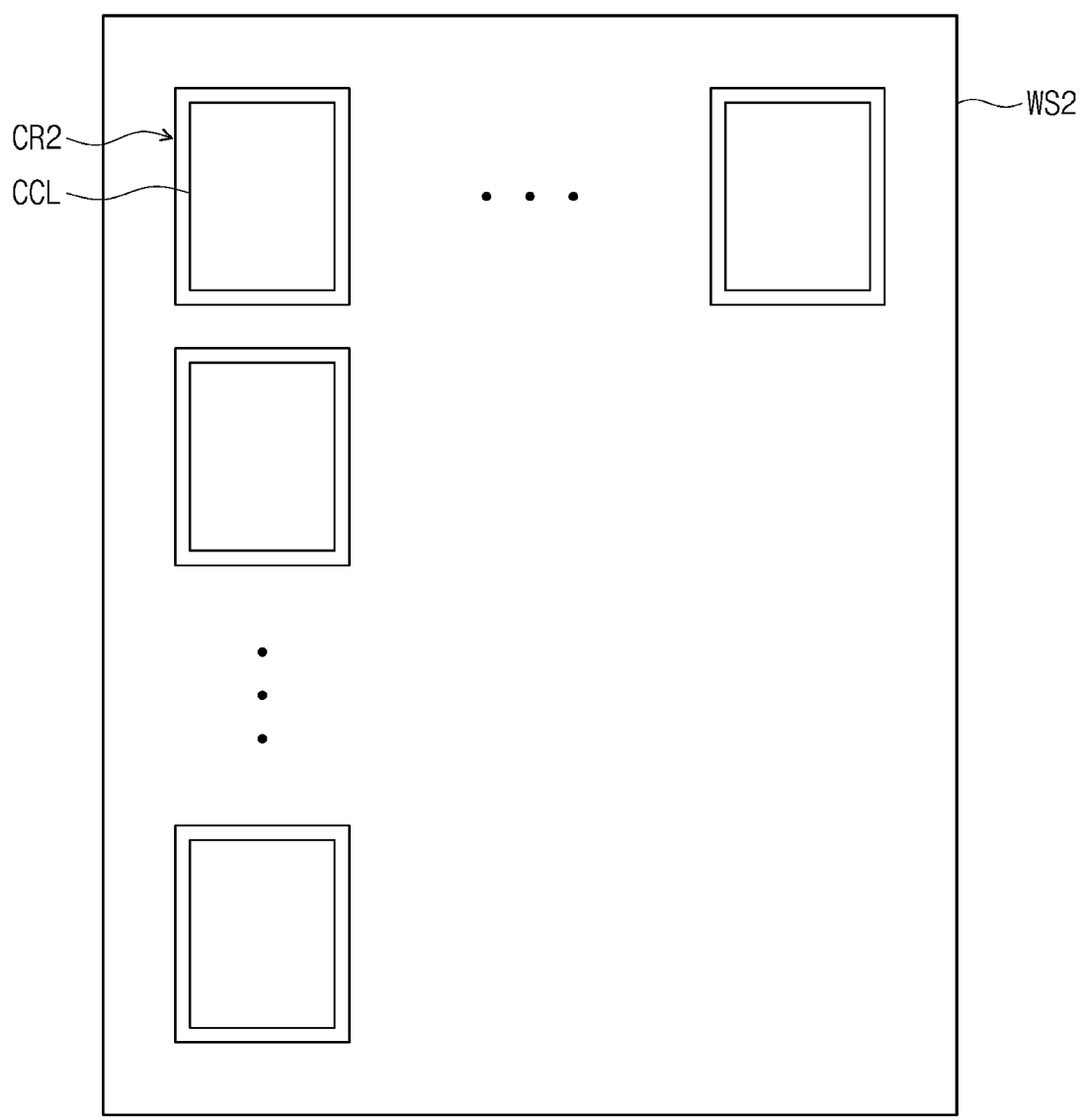
Figure 8B:
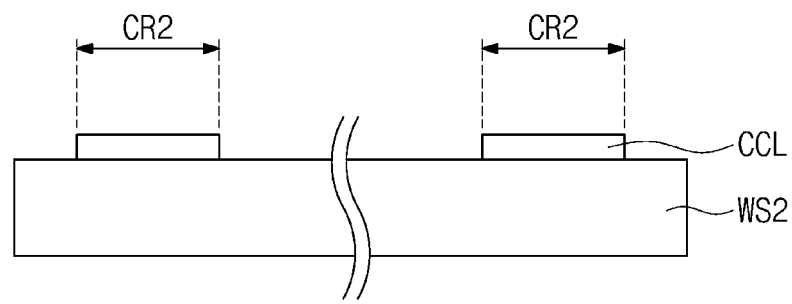

Referring to FIGS. 7B and 8B, a second working substrate WS2 may include a plurality of second cell regions CR2. Each of the second cell regions CR2 may be a region corresponding to the second base substrate BS2 of the display panel DP (e.g., see FIG. 3). At least one of the light-blocking layer BML (refer to FIG. 4B), the color filter layers CF1 to CF3 (refer to FIG. 4B), the first and second protection layers PL1 and PL2 (refer to FIG. 4B), or the color conversion layer CCL may be formed on each of the second cell regions CR2 of the second working substrate WS2. For convenience in illustration, only the color conversion layer CCL is illustrated in FIGS. 7B and 8B.

Figure 7C:
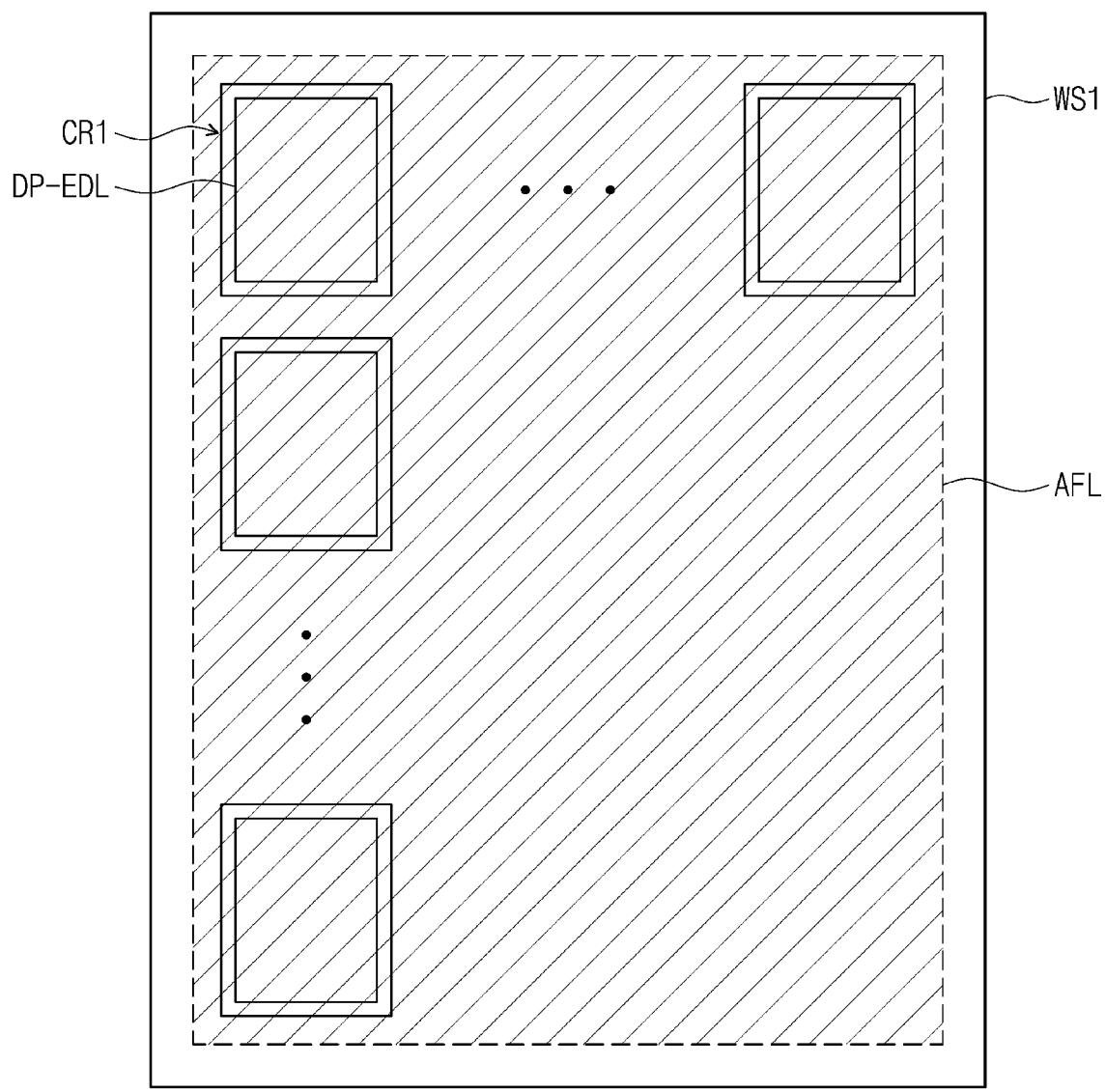
Figure 8C:
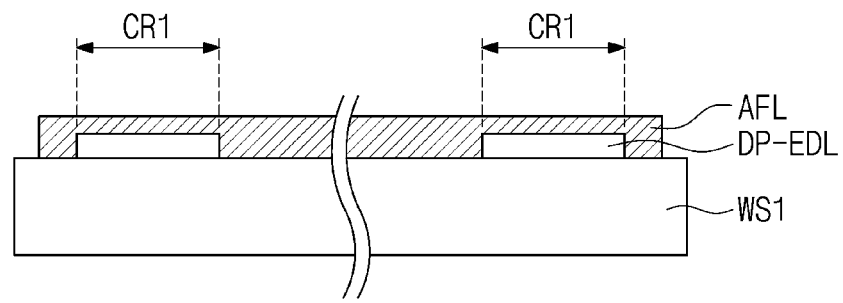

Referring to FIGS. 7C and 8C, the adhesive filling layer AFL may be provided on the first working substrate WS1. However, the inventive concepts are not limited thereto, and in some exemplary embodiments, the adhesive filling layer AFL may be provided on at least one of the first and second working substrates WS1 and WS2.

For example, the adhesive filling layer AFL may include an epoxy resin. In some exemplary embodiments, the adhesive filling layer AFL may be an optically clear adhesive (OCA) film, an optically clear resin (OCR) film, or a pressure sensitive adhesive (PSA) film.

Figure 7D:
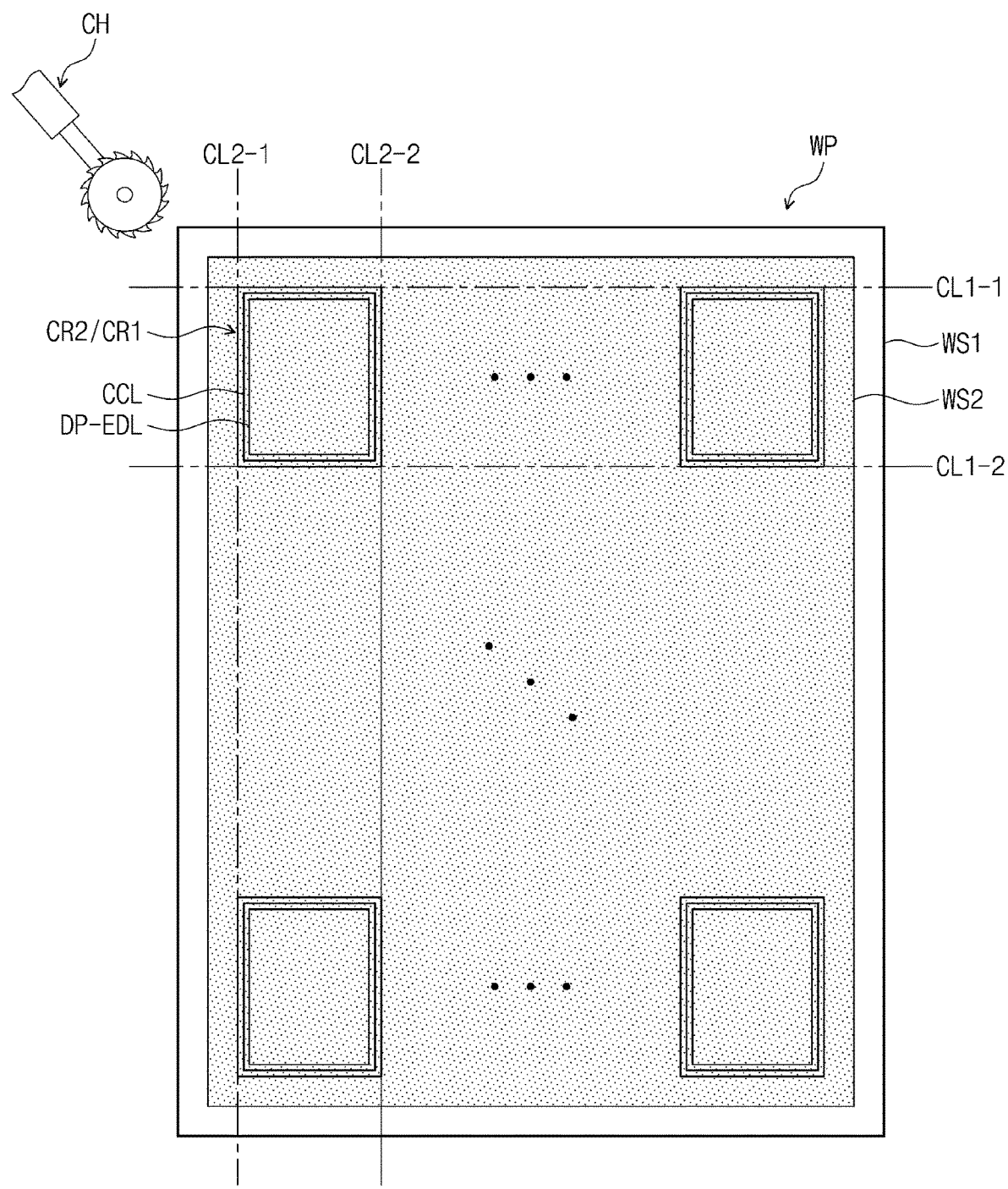
Figure 8D:
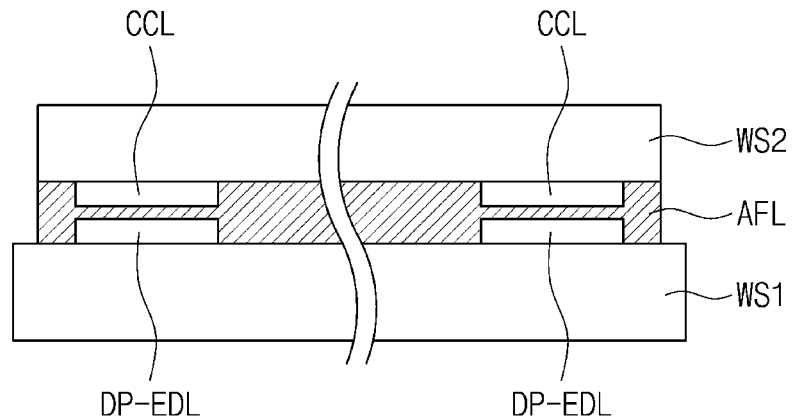

Referring to FIGS. 7D and 8D, the first and second working substrates WS1 and WS2 may be coupled to each other, after forming the adhesive filling layer AFL on one of the first and second working substrates WS1 and WS2. Hereinafter, the first and second working substrates WS1 and WS2 coupled to each other may be referred to as a working panel WP.

Next, the working panel WP may be divided into a plurality of pieces, each of which includes a corresponding one of the cell regions CR1 and CR2. For example, the working panel WP may be cut along a first cutting line CL1-1 and a second cutting line CL1-2, for example, using a cutting wheel CH, to form cell sticks. Each of the cell sticks may be further cut along a third cutting line CL2-1 and a fourth cutting line CL2-2.

Here, each of the cut pieces of the working panel WP may be referred to as a preliminary display panel. In particular, the preliminary display panel P-WP shown in FIG. 8E may be formed through the cutting of the working panel WP.

Figure 8E:
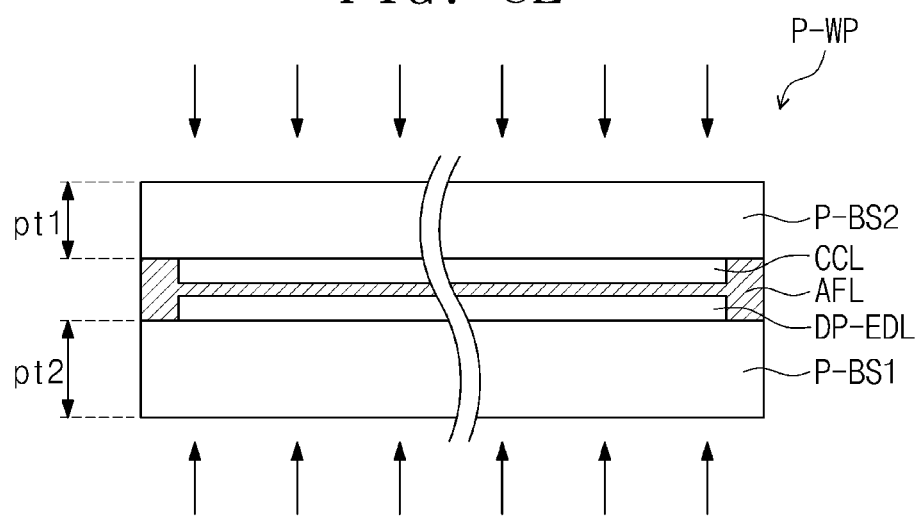

Referring to FIG. 8E, a preliminary display panel P-WP may include first and second preliminary base substrates P-BS1 and P-BS2. Thicknesses of the first and second preliminary base substrates P-BS1 and P-BS2 may be defined as first and second preliminary thicknesses pt1 and pt2. For example, each of the first and second preliminary thicknesses pt1 and pt2 may range from about 0.4 mm to about 0.7 mm.

The first and second preliminary base substrates P-BS1 and P-BS2, which have the first and second preliminary thicknesses pt1 and pt2, respectively, may be etched through an etching process. The process of etching the first and second preliminary base substrates P-BS1 and P-BS2 may be performed by dipping the preliminary display panel P-WP in etching solution, or by spraying etching solution onto both sides of the preliminary display panel P-WP.

According to an exemplary embodiment, each of the first and second preliminary base substrates P-BS1 and P-BS2 of the preliminary display panel P-WP may be etched. A rear surface of the first preliminary base substrate P-BS1 and a front surface of the second preliminary base substrate P-BS2 may be respectively etched during the etching process.

When the preliminary display panel P-WP is etched by the spraying method, the etching process may include a process of etching the first preliminary base substrate P-BS1 (hereinafter, a first etching process) and a process of etching the second preliminary base substrate P-BS2 (hereinafter, a second etching process). According to an exemplary embodiment, the first and second etching processes may be performed at the same time, and in some exemplary embodiments, the first and second etching processes may be performed in a non-concurrent manner, e.g., having a difference in starting time or time interval.

When the first and second etching processes are performed under the same process condition, the first and second preliminary base substrates P-BS1 and P-BS2 may be etched by substantially the same amount. As another example, when the first and second etching processes are performed under different process conditions, the first and second preliminary base substrates P-BS1 and P-BS2 may be etched by different amounts.

Figure 8F:
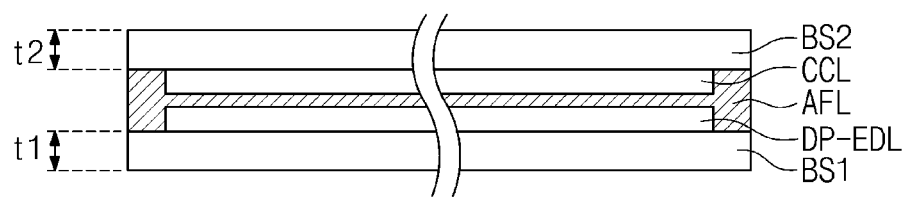

When each of the first and second preliminary base substrates P-BS1 and P-BS2 is etched by the etching process, the flexible display panel DP having the first and second base substrates BS1 and BS2 may be formed, as shown in FIG. 8F. According to an exemplary embodiment, the first and second base substrates BS1 and BS2 may have first and second thicknesses t1 and t2, respectively. For example, each of the first and second thicknesses t1 and t2 may range from about 0.01 mm to about 0.2 mm.

FIG. 8F exemplarily illustrates that the first and second thicknesses t1 and t2 are equal to each other, but the inventive concepts are not limited thereto. For example, in some exemplary embodiments, the first and second thicknesses t1 and t2 of the first and second base substrates BS1 and BS2 may be different from each other, within the afore-described thickness range.

Figure 9A:
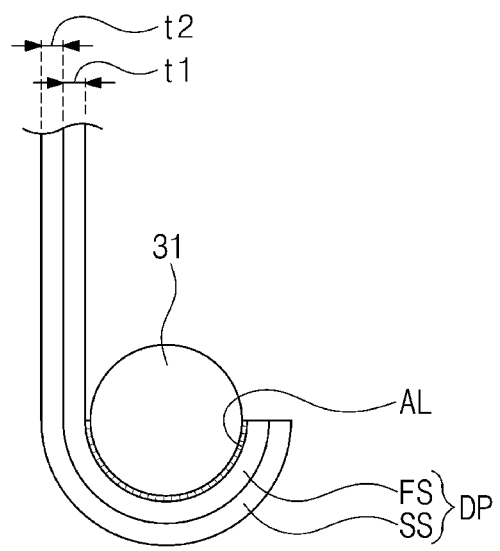
FIG. 9A is an enlarged view of a portion 'A1' of FIG. 2A.
Figure 9B:
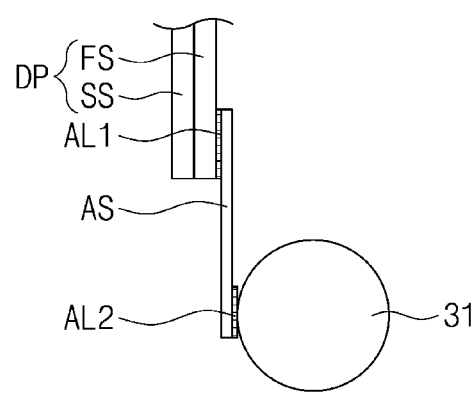
FIG. 9B is an enlarged view of the portion 'A1' according to another exemplary embodiment.

FIG. 9A is an enlarged view of a portion 'A1' of FIG. 2A according to an exemplary embodiment, and FIG. 9B is an enlarged view of the portion 'A1' according to another exemplary embodiment.

Referring to FIG. 9A, a portion of the flexible display panel DP may be attached and fastened to the roller 31. For example, the flexible display panel DP may be fastened to a portion of the roller 31 through an adhesive layer AL. The adhesive layer AL may be a double-sided tape having an adhesive property, for example. As such, a surface of the adhesive layer AL may be attached and fastened to the roller 31, and the other surface thereof may be attached and fastened to a portion of the flexible display panel DP.

FIG. 9A exemplarily illustrates that the adhesive layer AL is attached to the first substrate FS of the flexible display panel DP, but the inventive concepts are not limited thereto. For example, in some exemplary embodiments, one of the first and second substrates FS and SS, which is closer to the roller 31, may be in contact with the adhesive layer AL. If the roller 31 is closer to the second substrate SS than to the first substrate FS, the adhesive layer AL may be in contact with the second substrate SS.

Referring to FIG. 9B, the flexible display panel DP according to another exemplary embodiment may be fastened to the roller 31 through an auxiliary sheet AS. In this case, an end of the auxiliary sheet AS may be fastened to the flexible display panel DP by a first adhesive layer AL1 and an opposite end of the auxiliary sheet AS may be fastened to a portion of the roller 31 by a second adhesive layer AL2. Each of the first and second adhesive layers AL1 and AL2 may be a double-sided tape having an adhesive property, for example.

Figure 11:
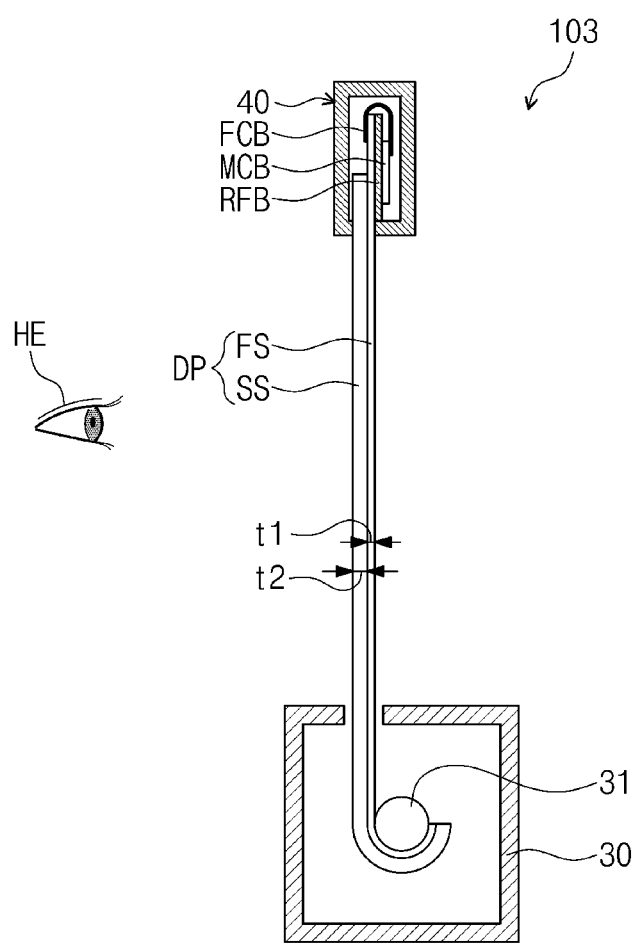
FIG. 11 is a cross-sectional view of a display device according to an exemplary embodiment.

FIG. 10 is a cross-sectional view of a display device according to an exemplary embodiment, and FIG. 11 is a cross-sectional view illustrating a display device according to an exemplary embodiment.

Referring to FIG. 10, a display device 102 according to an exemplary embodiment may further include a reinforcing plate RFB, which is interposed between the main circuit board MCB and the first substrate FS to enhance mechanical strength of the first substrate FS. The reinforcing plate RFB may be disposed on a rear surface of the first substrate FS. The reinforcing plate RFB may reinforce the mechanical strength of the first substrate FS at the second side portion of the first substrate FS. In particular, the reinforcing plate RFB may prevent the first substrate FS from being damaged by an external force or stress, which is exerted on the first substrate FS during attaching the main circuit board MCB and the flexible circuit board FCB to the second side portion of the first substrate FS.

The reinforcing plate RFB may be fastened to the rear surface of the first substrate FS by an adhesive layer or the like. The adhesive layer may be a double-sided tape having an adhesive property, for example. As such, the adhesive layer may fasten the main circuit board MCB to the reinforcing plate RFB.

FIG. 10 exemplarily illustrates that the reinforcing plate RFB is disposed at the second side portion of the first substrate FS, but the inventive concepts are not limited thereto. For example, a position of the reinforcing plate RFB may be determined depending on a position of the driving circuit unit including the main circuit board MCB and the flexible circuit board FCB. More particularly, when the driving circuit unit is disposed at the first side portion of the first substrate FS, the reinforcing plate RFB may also be disposed at the first side portion of the first substrate FS to absorb an impact, which may occur during a coupling process between the first substrate FS and the driving circuit unit.

Referring to FIG. 11, in a display device 103 according to an exemplary embodiment, the first and second substrates FS and SS may have different thicknesses from each other. For example, a first thickness t1 of the first substrate FS may be less than a second thickness t2 of the second substrate SS. However, the inventive concepts are not limited thereto, and in some exemplary embodiments, the second thickness t2 of the second substrate SS may be less than the first thickness t1 of the first substrate FS.

For example, the first thickness t1 of the first substrate FS and the second thickness t2 of the second substrate SS may have the relationship described in the following table

TABLE 1

| | First thickness of first substrate (t1) | Second thickness of second substrate (t2) |
|---|---|---|
| t1 > t2 | 0.2 mm | 0.01 mm |
| | 0.1 mm | 0.05 mm |
| | 0.2 mm | 0.1 mm |
| | 0.15 mm | 0.05 mm |

TABLE 1-continued

| | First thickness of first substrate (t1) | Second thickness of second substrate (t2) |
|---|---|---|
| t2 > t1 | 0.05 mm | 0.2 mm |
| | 0.01 mm | 0.1 mm |
| | 0.01 mm | 0.2 mm |

Figure 12:
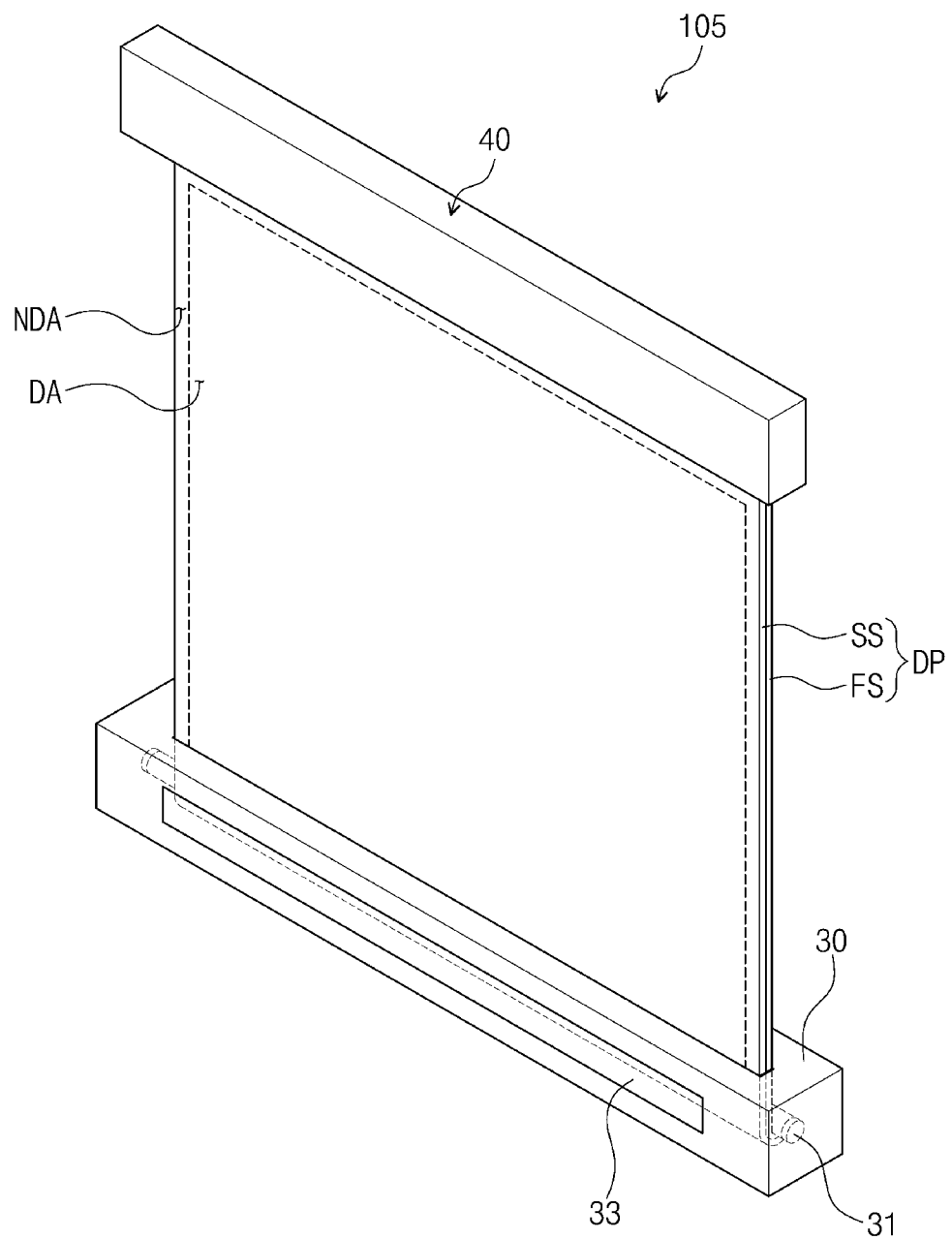
FIG. 12 is a perspective view of a display device according to an exemplary embodiment.
Figure 13:
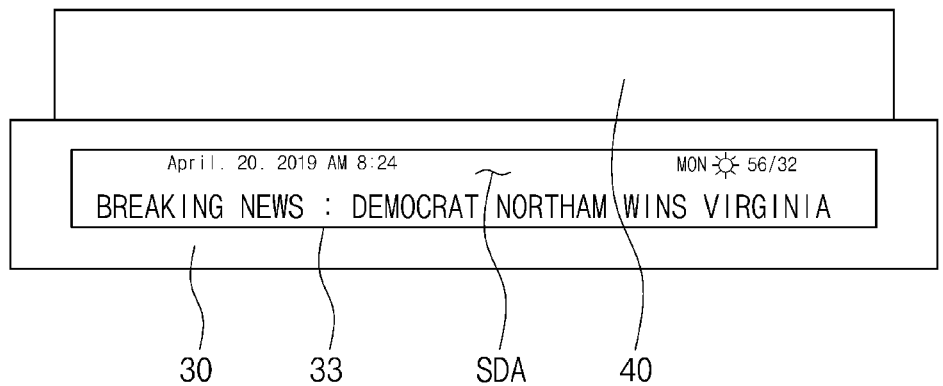
FIG. 13 is a front view exemplarily illustrating a standby state of the display device of FIG. 12.
Figure 14A:
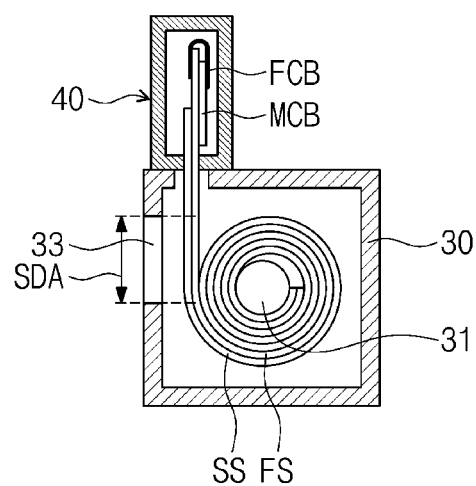
FIGS. 14A and 14B are cross-sectional views illustrating standby states of display devices according to exemplary embodiments.
Figure 14B:
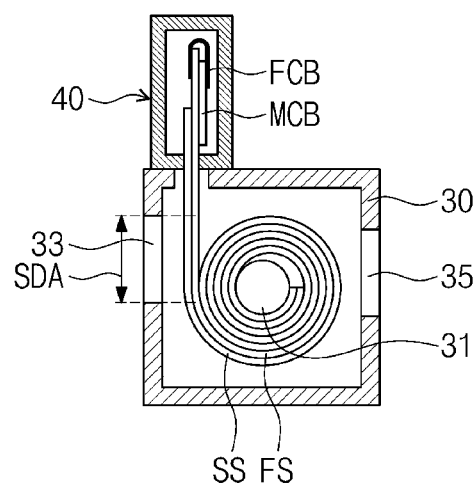

FIG. 12 is a perspective view of a display device according to an exemplary embodiment, and FIG. 13 is a front view illustrating a standby state of the display device of FIG. 12. FIGS. 14A and 14B are cross-sectional views illustrating standby states of display devices according to exemplary embodiments.

Referring to FIGS. 12 and 13, in a display device 105 according to an exemplary embodiment, the housing 30 may include a transmission window 33 exposing a partial region of the flexible display panel DP. For example, the transmission window 33 may be formed in a front portion of the housing 30. In this case, the front portion of the housing 30 may be defined as a portion that corresponds to a portion of the flexible display panel DP that displays an image to a user.

The housing 30 may be formed of an opaque material. In this case, the transmission window 33 may be formed by partially opening the front portion of the housing 30, and the transmission window 33 may be covered by a transparent layer, for example.

In the active state, an image may not be displayed through the transmission window 33, and in the standby state, a standby image may be displayed through the transmission window 33. The standby image may be an image that is displayed through a first region SDA of the flexible display panel DP. More particularly, in the active state, the first region SDA may be turned off, such that the standby image is not displayed, and in the standby state, the first region SDA may be turned on to display the standby image. As another example, in the active state, the transmission window 33 may be shielded by an additional shielding member.

For example, the standby image may include information associated with at least one of date, time, day of week, weather, temperature, and news caption, without being limited thereto.

In particular, referring to FIG. 14A, in the standby state, the flexible display panel DP is wound around the roller 31. In this case, a region that is not wound around the roller 31 and corresponds to the transmission window 33 may be defined as the first region SDA. If the display device 105 is changed to the active state, the first region SDA may be included in the display region DA and may be used to display an image.

In some exemplary embodiments, however, the standby image may still be displayed through the transmission window 33 during the active state. In particular, another region of the flexible display panel DP placed in the housing 30 may be operated to display the standby image.

Referring to FIG. 14B, the housing 30 may further include a sub-transmission window 35. The sub-transmission window 35 may be provided in a rear portion of the housing 30 to expose another region, i.e., a second region of the flexible display panel DP. The rear portion of the housing 30 may be defined as a portion opposite to a portion of the flexible display panel DP displaying an image to a user. In the standby state, the second region may display a sub-standby image through the sub-transmission window 35.

The transmission window 33 and the sub-transmission window 35 may have different sizes from each other, and images, which are disposed through the transmission window 33 and the sub-transmission window 35, may be the same or may differ from each other.

Figure 15A:
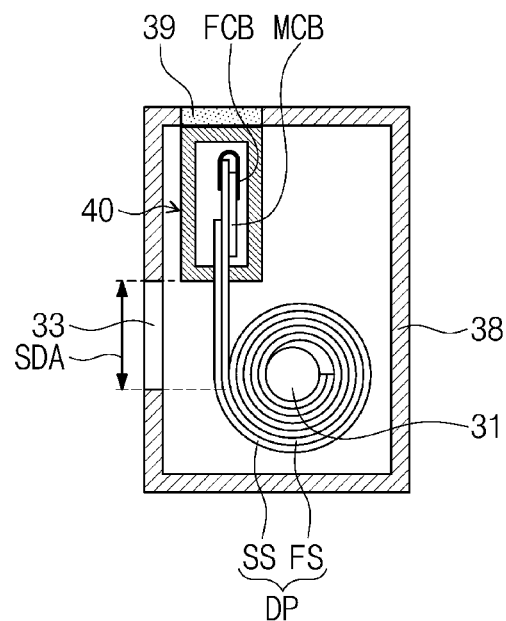
FIG. 15A is a cross-sectional view illustrating a standby state of a display device according to another exemplary embodiment, and 15B is a front view exemplarily illustrating a standby state of the display device of FIG. 15A.

FIG. 15A is a cross-sectional view illustrating a standby state of a display device according to another exemplary embodiment, and 15B is a front view exemplarily illustrating a standby state of the display device of FIG. 15A.

Figure 15B:
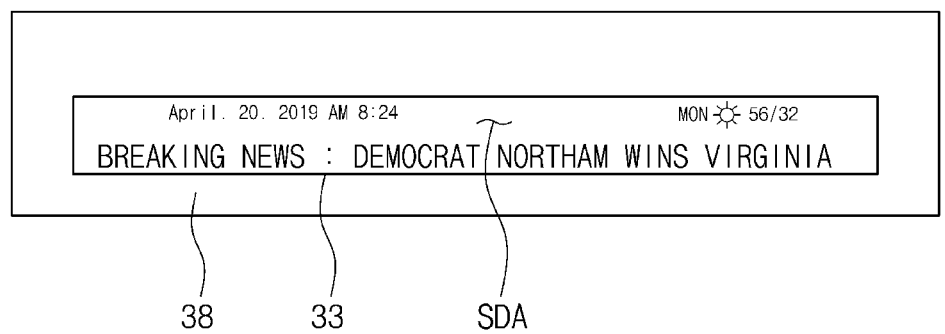

Referring to FIGS. 15A and 15B, a display device according to another exemplary embodiment may include the fastening frame 40 disposed in a housing 38, when it is in the standby state.

The housing 38 may include the transmission window 33 exposing a region of the flexible display panel DP. For example, the transmission window 33 may be provided in the front portion of the housing 38. In the standby state, the standby image may be displayed through the transmission window 33. For example, the standby image may include information on at least one of date, time, day of week, weather, temperature, and news caption, as shown in FIG. 15B, without being limited thereto.

In the standby state, the transmission window 33 may not be overlapped with the fastening frame 40. In particular, the fastening frame 40 may not be exposed through the transmission window 33. The housing 38 may include a space, in which the fastening frame 40 can be contained without blocking the transmission window 33. In addition, a door 39 may be formed in a portion of the housing 38, and may be opened or closed to selectively allow the fastening frame 40 to pass therethrough. Accordingly, in the standby state, when the fastening frame 40 is contained in housing 38, the door 39 may be closed, and in the active state, the door 39 may be opened and the fastening frame 40 may be drawn to the outside of the housing 38 through the opened door 39.

Figure 16A:
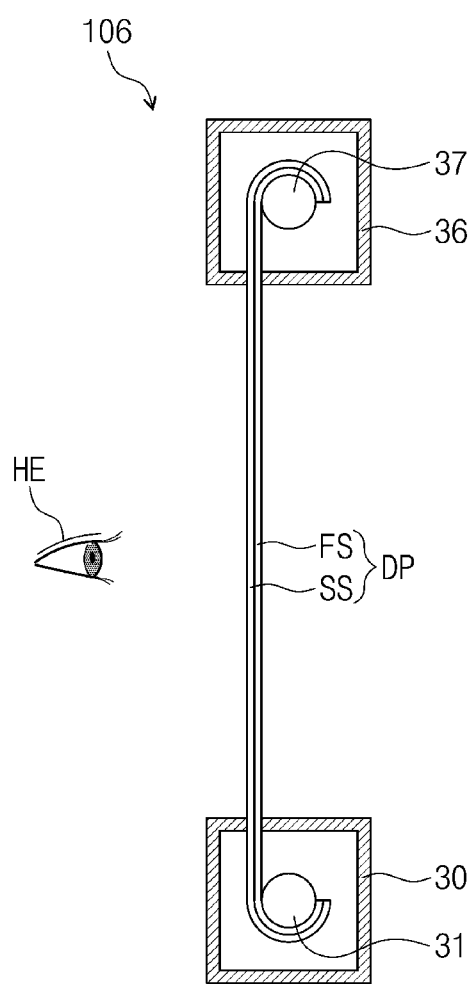
FIGS. 16A and 16B are cross-sectional views illustrating active states of display devices according to exemplary embodiments.
Figure 16B:
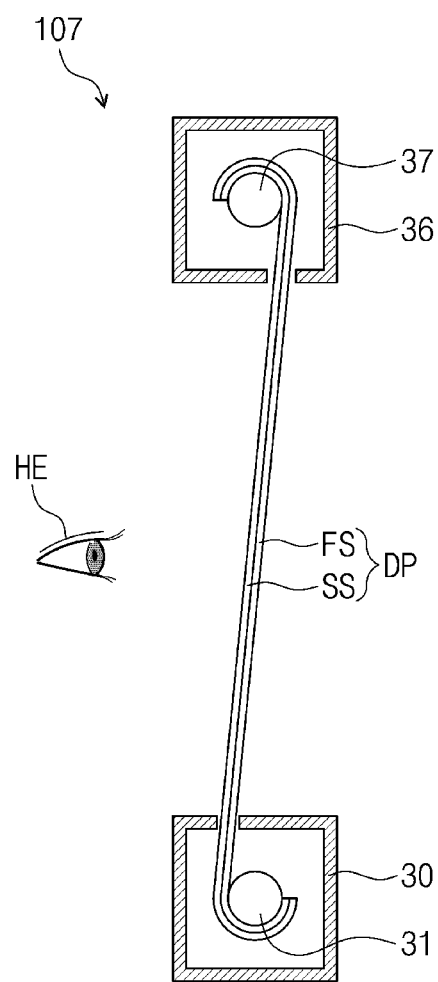

FIGS. 16A and 16B are cross-sectional views illustrating active states of display devices according to exemplary embodiments.

Referring to FIGS. 16A and 16B, a display device 106 according to an exemplary embodiment may include a first housing 30, in which a first roller 31 is contained, and a second housing 36, in which a second roller 37 is contained.

The first side of the flexible display panel DP may be fastened to the first roller 31, and the second side of the flexible display panel DP may be fastened to the second roller 37. When the display device 106 is in the standby state, the flexible display panel DP may be wound around at least one of the first and second rollers 31 and 37, and may be contained in a corresponding one of the first and second housings 30 and 36. For example, if the flexible display panel DP is wound around the first roller 31, the second housing 36 may be moved toward the first housing 30 and may be in contact with the first housing 30.

When the display device 106 is changed to the active state, the flexible display panel DP may be unwound from the first roller 31 and may be stretched, and a distance between the second housing 36 and the first housing 30 may be maintained to a specific value.

In some exemplary embodiments, the display device 106 may further include a strain gauge, which is disposed at each of the first and second sides of the flexible display panel DP to measure a change in mechanical characteristics of the flexible display panel DP in the standby state.

If a signal measured by the strain gauge is beyond a predetermined critical range (hereinafter, anomalous deformation), a winding position of the flexible display panel DP may be adjusted. For example, if the anomalous deformation is found when the flexible display panel DP wound around the first roller 31 in the standby state, the winding position of the flexible display panel DP may be automatically adjusted, such that the flexible display panel DP is wound around the second roller 37. In this manner, it may be possible to prevent a change in mechanical characteristics of the flexible display panel DP, which may occur when the winding position of the flexible display panel DP is maintained for a long period of time.

FIG. 16A exemplarily illustrates that rear surfaces of the first and second side portions of the first substrate FS are fastened to the first and second rollers 31 and 37, respectively, but the inventive concepts are not limited thereto.

For example, as shown in FIG. 16B, in a display device 107 according to another exemplary embodiment, a rear surface of the first side portion of the first substrate FS may be fastened to the first roller 31, and a front surface of the second side portion of the second substrate SS may be fastened to the second roller 37. In this case, the front surface may be defined as a surface displaying an image to the user HE, and the rear surface may be defined as a surface opposite to the front surface, and cannot be seen by the user HE.

Figure 17A:
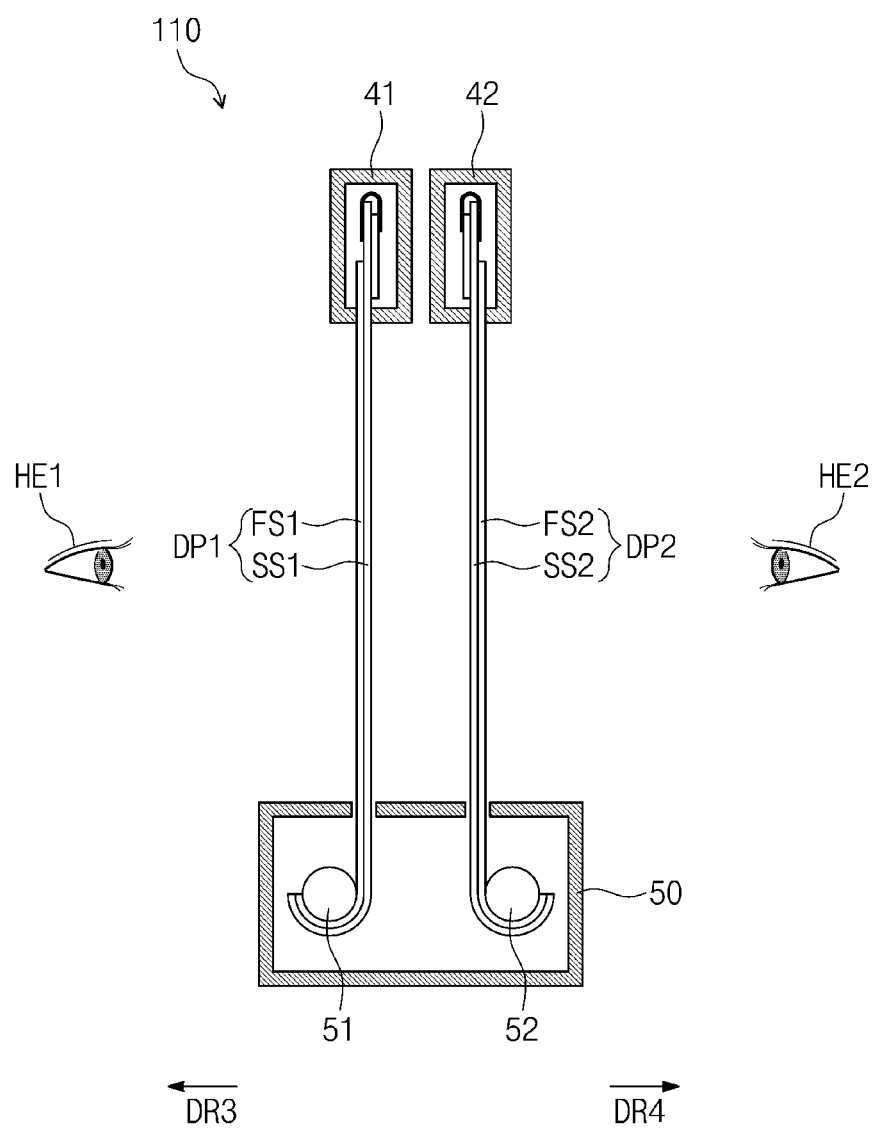
FIGS. 17A and 17B are cross-sectional views illustrating active states of double-side display devices according to exemplary embodiments.
Figure 17B:
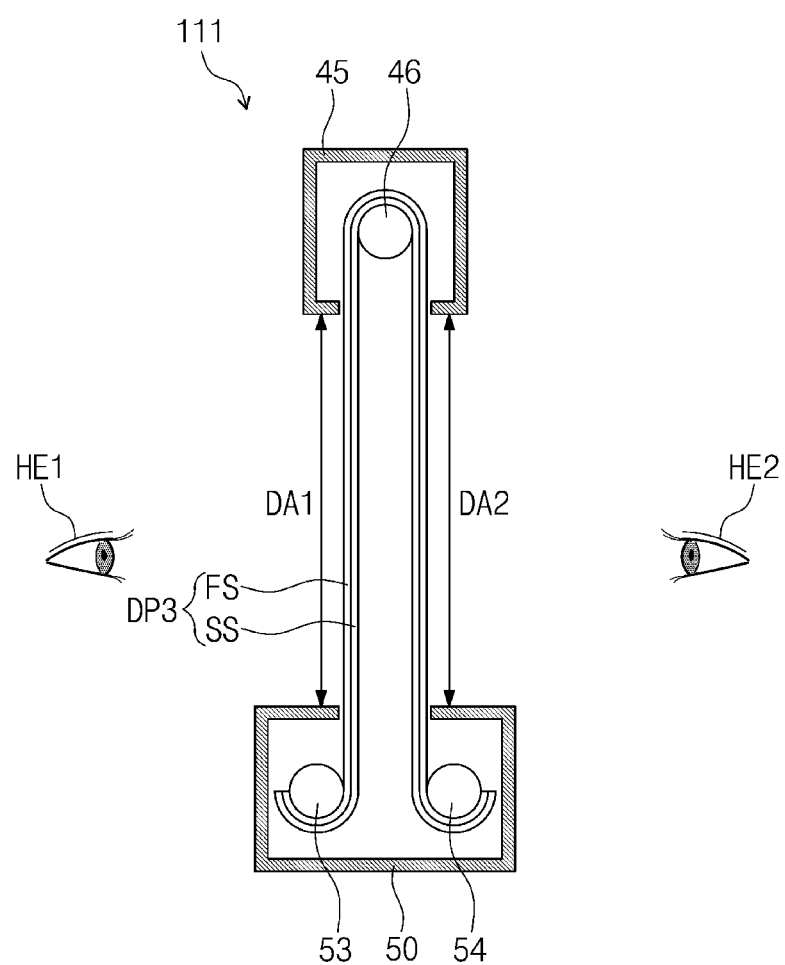

FIGS. 17A and 17B are cross-sectional views illustrating active states of double-side display devices according to exemplary embodiments.

Referring to FIG. 17A, a display device 110 according to an exemplary embodiment may include a housing 50, in which first and second rollers 51 and 52 are contained, and first and second fastening frames 41 and 42. The display device 110 may include a first flexible display panel DP1 fastened to the first roller 51 and a second flexible display panel DP2 fastened to the second roller 52.

A first side portion of the first flexible display panel DP1 may be fastened to the first roller 51, and a second side portion of the first flexible display panel DP1 may be fastened to the first fastening frame 41. A second side portion of the second flexible display panel DP2 may be fastened to the second roller 52, and a second side portion of the second flexible display panel DP2 may be fastened to the second fastening frame 42.

As shown in FIG. 17A, the first flexible display panel DP1 may display an image in the third direction DR3, and the second flexible display panel DP2 may display an image in a fourth direction DR4 opposite to the third direction DR3. As such, a first user HE1 may recognize an image displayed through the first flexible display panel DP1 at a first position, and a second user HE2 may recognize an image displayed through the second flexible display panel DP2 at a second position. In particular, the display device 110 of FIG. 17A may display the images in two different directions, e.g., DR3 and DR4.

FIG. 17A exemplary illustrates that the first and second fastening frames 41 and 42 are separated from each other, but the inventive concepts are not limited thereto. For example, in some exemplary embodiments, the first and second fastening frames 41 and 42 may be coupled to each other, which may be detachable from each other. Accordingly, when an image is displayed in only one direction, the first and second fastening frames 41 and 42 may be separated from each other and only one of the fastening frames may be moved.

Referring to FIG. 17B, a display device 111 according to an exemplary embodiment may include the housing 50, in which third and fourth rollers 53 and 54 are contained, a fastening frame 45, in which a fifth roller 46 is contained, and the flexible display panel DP3.

An end portion of the flexible display panel DP3 may be fastened to the third roller 53, and an opposite end portion of the flexible display panel DP3 may be fastened to the fourth roller 54. The fifth roller 46 may be fastened to a central portion of the flexible display panel DP3.

The third and fourth rollers 53 and 54 may rotate in opposite directions. In the standby state, a first portion of the flexible display panel DP3 may be wound around the third roller 53 and may be contained in the housing 50, and a second portion of the flexible display panel DP3 may be wound around the fourth roller 54 and may be contained in the housing 50. The first portion of the flexible display panel DP3 may be defined as a portion that is positioned at one side of the central portion of the flexible display panel DP, at which the fifth roller 46 is placed, and the second portion may be defined as another portion that is positioned at an opposite side of the central portion.

In the active state, the first portion of the flexible display panel DP3 may be unwound from the third roller 53 and may be stretched, and the second portion may be unwound from the fourth roller 54 and may be stretched. In this case, the first user HE1 may recognize an image displayed on a first display region DA1 of the stretched portion of the flexible display panel DP3. The second user HE2 may recognize an image displayed on a second display region DA2 of the stretched portion of the flexible display panel DP3.

The fastening frame 45 may have an accommodation space, in which the fifth roller 46 can be contained. The fastening frame 45 may further include an additional mechanical part, which may be used to support the flexible display panel DP in the unwound state and to maintain the active state. For example, the mechanical part may be coupled to the fifth roller 46 to lift the fastening frame 45 in an upward direction and to uniformly maintain a distance between the fifth roller 46 and the housing 50 when the fastening frame 45 is placed at a maximally lifted position.

Figure 19:
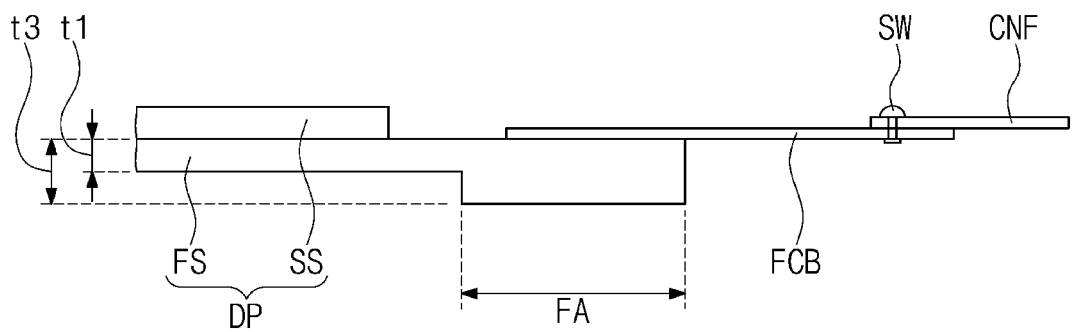
FIG. 19 is a cross-sectional view of the flexible display panel shown in FIG. 18.
Figure 20:
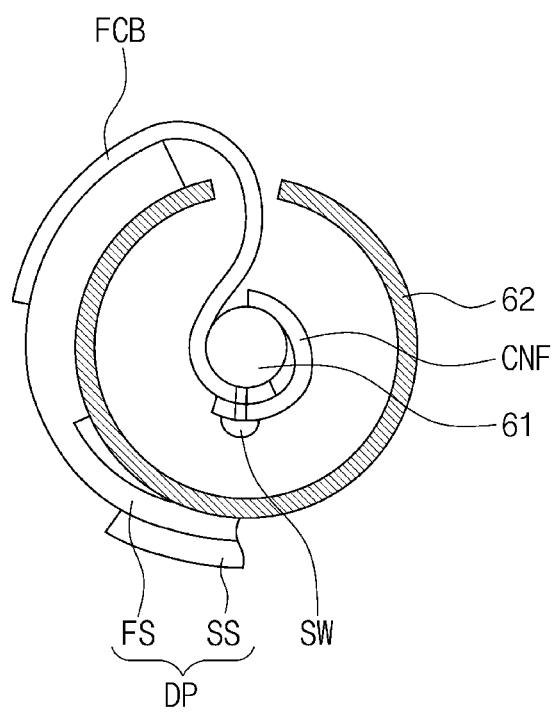
FIG. 20 is a cross-sectional view illustrating a structure, in which a double roller and a flexible display panel are coupled to each other, according to an exemplary embodiment.

FIG. 18 is a plan view illustrating a structure, in which a flexible display panel and an inner roller are coupled to each other, according to an exemplary embodiment, FIG. 19 is a cross-sectional view of the flexible display panel shown in FIG. 18, and FIG. 20 is a cross-sectional view illustrating a structure, in which a double roller and a flexible display panel are coupled to each other, according to an exemplary embodiment.

Referring to FIGS. 18 to 20, the flexible display panel DP according to an exemplary embodiment may include the first substrate FS and the second substrate SS. The flexible circuit board FCB may be attached to a portion of the first substrate FS. In a pad region FA, to which a side portion of the flexible circuit board FCB is attached, the first substrate FS may have a third thickness t3 that is greater than the first thickness t1. In particular, in order to reinforce the mechanical strength of the first substrate FS in the pad region FA attached with the flexible circuit board FCB, the first substrate FS may have the third thickness t3 that is greater than the thickness t1 of other regions.

As shown in FIGS. 19 and 20, a display device according to an exemplary embodiment may include an outer roller 62, around which the flexible display panel DP is wound, and an inner roller 61, around which the flexible circuit board FCB is wound.

A plurality of adhesion films CNF may be provided between the inner roller 61 and the flexible circuit board FCB. The adhesion films CNF may be connected to the flexible circuit board FCB through a coupling member SW. The adhesion films CNF may be attached and fastened to the inner roller 61. A portion of the flexible circuit board FCB may be wound around the inner roller 61 through the adhesion films CNF.

An opposite portion of the flexible circuit board FCB may be drawn to the outside of the outer roller 62. As such, a portion of the flexible display panel DP, to which the flexible circuit board FCB is attached, may be wound around the outer roller 62. In this manner, the rollers, around which the flexible circuit board FCB and the flexible display panel DP are respectively wound, may be disposed to be separated from each other. Accordingly, the flexible circuit board FCB having high stiffness may be wound around the inner roller 61 having a small diameter, and the flexible display panel DP having relatively low stiffness may be wound around the outer roller 62 having a larger diameter. In this manner, a stress exerted on the flexible display panel DP may be reduced.

According to an exemplary embodiment, a flexible display panel of a rollable display device may include two thin glass substrates, which may be coupled to each other using an adhesive filling layer. As such, a stress exerted on the flexible display panel during a rolling operation may be reduced.

In addition, a portion that may be weak to an external impact, such as a portion wound around a roller or attached with a flexible circuit board, may have a structure reinforcing a mechanical strength of the flexible display panel. As such, the flexible display panel may be prevented or at least be suppressed from being deformed or damaged.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device, comprising:
    a flexible display panel having a side portion and an opposite side portion;
    a roller disposed on the side portion of the flexible display panel and configured to wind the flexible display panel;
    a driving circuit including a main circuit board and a flexible circuit board disposed on the opposite side portion of the flexible display panel and not being configured to be wound by the roller; and
    a reinforcement film disposed between the main circuit board and the opposite side portion of flexible display panel, adjacent to the flexible circuit board, and on a rear surface of the opposite side portion of flexible display panel,
    wherein the flexible display panel comprises:
        a first substrate including a first base substrate having a display region and a non-display region adjacent to each other, and a light emitting element layer including a plurality of light emitting elements disposed on the display region of the first base substrate;
        a second substrate including a second base substrate opposing the first base substrate, and a color conversion layer disposed on the second base substrate and corresponding to each of the plurality of light emitting elements; and
        an adhesive filling layer disposed in the display region to form a cell gap between the first substrate and the second substrate, and disposed in the non-display region to be in contact with the first and second base substrates to couple and seal the first and second base substrates when the flexible display panel is wound by the roller.

2. The display device of claim 1, wherein the first and second base substrates comprise a glass material.

3. The display device of claim 1, wherein:
the adhesive filling layer comprises a transparent epoxy resin; and
the adhesive filling layer disposed in the display region has a first thickness and the adhesive filing layer disposed in the non-display region has a second thickness greater than the first thickness.

4. The display device of claim 1, wherein each of the first and second base substrates has a thickness ranging from about 0.01 mm to about 0.2 mm.

5. The display device of claim 4, wherein the thicknesses of the first and second base substrates are equal to each other or are different from each other.

6. The display device of claim 1, further comprising a fastening frame fastened to the opposite side portion of the flexible display panel and accommodating the flexible circuit board therein.

7. The display device of claim 6, wherein the reinforcement film is disposed adjacent to the flexible circuit board and on a rear surface of the first base substrate and is accommodated in the fastening frame.

8. The display device of claim 1, further comprising an adhesive layer fastening the side portion of the flexible display panel to the roller.

9. The display device of claim 1, further comprising:
an auxiliary sheet disposed between the side portion of the flexible display panel and the roller;
a first adhesive layer fastening the auxiliary sheet to the side portion of the flexible display panel; and
a second adhesive layer fastening the auxiliary sheet to the roller.

10. The display device of claim 1,
wherein the roller comprises:
an inner roller configured to wind the flexible circuit board; and
an outer roller enclosing the inner roller and configured to wind the flexible display panel.

11. The display device of claim 10, wherein:
the first substrate further includes a pad region to which the flexible circuit board is mounted; and
a thickness of the first substrate is greater in the pad region than in the display region.

12. The display device of claim 1, wherein:
the light emitting element layer comprises a light emitting layer disposed in common in the plurality of light emitting elements and configured to emit a first color light; and
the color conversion layer comprises:
a first color conversion layer configured to convert a wavelength of the first color light to output a second color light;
a second color conversion layer configured to convert the wavelength of the first color light and output a third color light; and
a third color conversion layer configured to transmit the first color light.

13. The display device of claim 12, wherein:
the first, second, and third color lights are blue, red, and green lights;
the first color conversion layer includes a red quantum dot; and
the second color conversion layer includes a green quantum dot.

14. A display device, comprising:
a flexible display panel having a side portion and an opposite side portion;
a roller disposed on the side portion of the flexible display panel and configured to wind the flexible display panel;
a driving circuit including a main circuit board and a flexible circuit board disposed on the opposite side portion of the flexible display panel and not being configured to be wound by the roller; and
a reinforcement film disposed between the main circuit board and the opposite side portion of flexible display panel, adjacent to the flexible circuit board, and on a rear surface of the opposite side portion of the flexible display panel,
wherein the flexible display panel comprises:
a first substrate including a first base substrate having a display region and a non-display region adjacent to each other, and a light emitting element layer including a plurality of light emitting elements disposed on the display region of the first base substrate, the first base substrate comprising a glass material;
a second substrate including a second base substrate opposing the first base substrate and includes a glass material, and a color conversion layer disposed on the second base substrate to correspond to each of the plurality of light emitting elements; and
an adhesive filling layer disposed in the display region to form a cell gap between the first substrate and the second substrate, and disposed in the non-display region to be in contact with the first and second base substrates to couple and seal the first and second base substrates when the flexible display panel is wound by the roller, and
wherein each of the light emitting elements has a length ranging from several nanometers to several hundreds of micrometers.

15. The display device of claim 14, wherein:
the adhesive filling layer comprises a transparent epoxy resin; and
the adhesive filling layer contacts the first and second base substrates only in the non-display region.

16. The display device of claim 14, wherein each of the first and second base substrates has a thickness ranging from about 0.01 mm to about 0.2 mm.

17. A display device, comprising:
a flexible display panel having a side portion and an opposite side portion and including a display region and a non-display region adjacent to each other;
a roller disposed on a side portion of the flexible display panel and configured to wind the flexible display panel;
a housing accommodating the roller;
a driving circuit including a main circuit board and a flexible circuit board disposed on the opposite side portion of the flexible display panel and not being configured to be wound by the roller; and
a reinforcement film disposed between the main circuit board and the opposite side portion of flexible display panel, adjacent to the flexible circuit board, and on a rear surface of the opposite side portion of the flexible display panel,
wherein the housing includes a transmission window disposed in a front portion of the housing and exposing a first region of the flexible display panel, wherein the first region is configured to display a first image through the transmission window, wherein the flexible display panel comprises:
- a first substrate including a display region and a non-display region adjacent to each other;
- a second substrate opposing the first substrate; and
- an adhesive filling layer disposed between the first substrate and the second substrate, and wherein the adhesive filling layer disposed in the display region has a first thickness and the adhesive filing layer disposed in the non-display region has a second thickness greater than the first thickness.

18. The display device of claim 17, wherein the first region is configured to display the first image in a standby state.

19. The display device of claim 17, wherein, in an active state, the first region of the flexible display panel becomes a part of the display region.

20. The display device of claim 17, wherein:
- the housing further comprises a sub-transmission window disposed in a rear portion thereof and exposing a second region of the flexible display panel; and
- the second region is configured to display a second image through the sub-transmission window.

21. The display device of claim 20, wherein the second region is configured to display the second image in a standby state.

22. The display device of claim 17, further comprising a fastening frame fastened to the opposite side portion of the flexible display panel and accommodating the flexible circuit board and the reinforcement film therein, wherein the fastening frame contacts the housing in a standby state, and is spaced apart from the housing in an active state.

23. The display device of claim 17, wherein the first image includes information on at least one of date, time, day of week, weather, temperature, and news caption.

* * * * *